(12) United States Patent
Okada et al.

(10) Patent No.: US 9,673,165 B2
(45) Date of Patent: *Jun. 6, 2017

(54) COMPONENT MOUNTING APPARATUS

(71) Applicant: Panasonic Corporation, Osaka (JP)

(72) Inventors: Yasuhiro Okada, Yamanashi (JP);
Chihiro Igarashi, Yamanashi (JP);
Toshihiko Tsujikawa, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/472,614

(22) Filed: Aug. 29, 2014

(65) Prior Publication Data

US 2015/0083336 A1 Mar. 26, 2015

(30) Foreign Application Priority Data

Sep. 24, 2013 (JP) .................................. 2013-196430

(51) Int. Cl.
*B32B 41/00* (2006.01)
*H01L 23/00* (2006.01)

(52) U.S. Cl.
CPC .............. *H01L 24/75* (2013.01); *H01L 24/83* (2013.01); *H01L 2224/27436* (2013.01); *H01L 2224/293* (2013.01); *H01L 2224/2929* (2013.01); *H01L 2224/743* (2013.01); *H01L 2224/75745* (2013.01); *H01L 2224/83192* (2013.01); *H01L 2224/83201* (2013.01); *H01L 2224/83851* (2013.01)

(58) Field of Classification Search
CPC . H01L 2224/838; H01L 24/27; Y10T 156/10; Y10T 29/49826; Y10T 29/49004; Y10T 156/1084; Y10T 156/17; B29C 65/00; B29C 47/0021; B29C 47/065; B29C 47/067; B29C 66/8322; B29C 66/43; B29C 55/20
USPC .......... 156/60, 64, 73.4, 230, 297, 366, 378, 156/502, 538, 580
See application file for complete search history.

(56) References Cited

U.S. PATENT DOCUMENTS

2015/0083335 A1* 3/2015 Okada et al. ................. 156/366

FOREIGN PATENT DOCUMENTS

JP 2012-227194 A 11/2012

\* cited by examiner

*Primary Examiner* — Michael N Orlando
*Assistant Examiner* — Joshel Rivera
(74) *Attorney, Agent, or Firm* — Pearne & Gordon, LLP

(57) ABSTRACT

A component mounting apparatus includes a tape attaching unit, a component mounting unit and a component compression unit provided in this order. A time measuring unit measures time having passed after completion of predetermined work performed on all the substrates transferred to the tape attaching unit, the component mounting unit, and the component compression unit, respectively. When preparation for transferring the substrates to the tape attaching unit is not completed within a predetermined time after the start of measurement performed by the time measuring unit, the respective substrates, which wait in the tape attaching unit, the component mounting unit, and the component compression unit, are forcibly transferred to the downstream sides and predetermined work is performed on the respective substrates that are forcibly transferred to the component mounting unit and the component compression unit.

5 Claims, 20 Drawing Sheets

COMPONENT MOUNTING APPARATUS

CROSS REFERENCE TO RELATED APPLICATIONS

The present application is based on and claims the benefit of Japanese patent application No. 2013-196430 filed on Sep. 24, 2013, the contents of which are incorporated by reference in its entirety.

BACKGROUND OF THE INVENTION

1. Field of the Invention

The present invention relates to a component mounting apparatus that manufactures a mounting substrate by compressing a component mounted on a substrate with an adhesive tape interposed therebetween.

2. Description of the Related Art

A component mounting apparatus in which a tape attaching device, a temporary compression device, and a normal compression device are provided in this order from the upstream side is known as an component mounting apparatus that mounts a component on a substrate such as a liquid crystal panel with an adhesive tape such as an anisotropic conductive tape (ACF tape) interposed therebetween (for example, see JP-A-2012-227194). A feed apparatus, which feeds substrates, or the like is disposed on the upstream side of the component mounting apparatus, and a collecting apparatus, which collects mounting substrates, or the like is disposed on the downstream side of the component mounting apparatus. Further, conveyor members as substrate conveying mechanisms are disposed between the respective devices.

First, a substrate, which is conveyed to the component mounting apparatus from the upstream side, is transferred to the tape attaching device, and an adhesive tape is attached to the substrate. Then, the substrate is transferred to the temporary compression device and a component is temporarily compressed to (mounted on) the substrate with an adhesive tape interposed therebetween. After that, the substrate is transferred to the normal compression device, and the component is normally compressed to the substrate while being pressed by the compression tool. A mounting substrate is manufactured by the above-mentioned steps. The substrate, which has been subjected to normal compression, is carried to the downstream side from the component mounting apparatus.

From the standpoint of improving work tact, various kinds of work performed in the tape attaching device, the temporary compression device, and the normal compression device are simultaneously performed in parallel. Accordingly, the transfer of the substrate to the tape attaching device from an upstream apparatus, the transfer of the substrate to the temporary compression device from the tape attaching device, the transfer of the substrate to the normal compression device from the temporary compression device, and the transfer of the substrate to a downstream apparatus from the normal compression device are also simultaneously performed in parallel.

When preparation for transferring a substrate to the tape attaching device from the upstream apparatus is not completed due to a certain trouble under this transfer form, the substrate having been completely subjected to work in each downstream apparatus waits for transfer. In this case, the adhesion of the adhesive tape, which is attached to the substrate in the tape attaching device, deteriorates as time passes. For this reason, even though a component is normally compressed to the substrate after waiting for transfer is cancelled, a mounting defect caused by the lack of adhesion may be generated. In an example disclosed in JP-A-2012-227194, the occurrence of a case in which a component is compressed to a substrate with a deteriorated adhesive tape interposed therebetween is prevented by the recognition of time, which has passed after the attachment of the adhesive tape to the substrate, as one solution to this problem.

SUMMARY OF THE INVENTION

However, according to the related art, it is possible to prevent the compression of the component, which is performed on the substrate to which the deteriorated adhesive tape is attached, but the following problems have been generated. That is, much time and effort have been required to peel the adhesive tape for the reuse of the substrate, and the adhesive tape has been wasted. Moreover, since it is difficult to peel a certain adhesive tape, there also is a problem in that the substrate should be discarded when the adhesive tape cannot be peeled so that the substrate can be reused.

Accordingly, one non-limited object of the present invention is to provide a component mounting apparatus that can compress a component to a substrate while suppressing the deterioration of an adhesive tape.

An aspect of the present invention provides a component mounting apparatus including: a tape attaching unit that attaches an adhesive tape to a substrate; a component mounting unit that is provided on a downstream side of the tape attaching unit and mounts a component on the adhesive tape attached to the substrate; a component compression unit that is provided on a downstream side of the component mounting unit and compresses the component, which is mounted on the substrate, to the substrate with the adhesive tape interposed therebetween; a first substrate transfer unit that transfers the substrate, to which the adhesive tape is attached, to the component mounting unit from the tape attaching unit; a second substrate transfer unit that transfers the substrate, on which the component is mounted, to the component compression unit from the component mounting unit; and a time measuring unit that measures time having passed after completion of predetermined work performed on all the substrates transferred to the tape attaching unit, the component mounting unit, and the component compression unit, respectively, wherein when preparation for transferring the substrates to the tape attaching unit is not completed within a predetermined time after the start of measurement performed by the time measuring unit, the respective substrates, which wait in the tape attaching unit, the component mounting unit, and the component compression unit, are forcibly transferred to their downstream sides and predetermined works are performed on the respective substrates that are forcibly transferred to the component mounting unit and the component compression unit.

In the component mounting apparatus, the component compression unit may compress the component before deterioration of the adhesive tape attached to the substrate forcibly transferred to the downstream side from the tape attaching unit.

In the component mounting apparatus the predetermined work used for starting time measuring by the time measuring unit may indicate preparation for transferring the substrates, which have been completely subjected to kinds of mounting work in the tape attaching unit, the component mounting unit, and the component compression unit, respectively, to the downstream side.

Another aspect of the present invention provides a component mounting apparatus including: a tape attaching unit that attaches an adhesive tape to a substrate; a component mounting unit that is provided on a downstream side of the tape attaching unit and mounts a component on the adhesive tape attached to the substrate; a component compression unit that is provided on a downstream side of the component mounting unit and compresses the component, which is mounted on the substrate, to the substrate with the adhesive tape interposed therebetween; a substrate carrying-out unit that is provided on a downstream side of the component compression unit and carries out the substrate on which the component is compressed; a first substrate transfer unit that transfers the substrate, to which the adhesive tape is attached, to the component mounting unit from the tape attaching unit; a second substrate transfer unit that transfers the substrate, on which the component is mounted, to the component compression unit from the component mounting unit; a third substrate transfer unit that transfers the substrate, on which the component is compressed, to the substrate carrying-out unit from the component compression unit; and a time measuring unit that measures time having passed after completion of predetermined work performed on all the substrates transferred to the tape attaching unit, the component mounting unit, and the component compression unit, respectively, wherein when preparation for transferring the substrates to the tape attaching unit is not completed within a predetermined time after the start of measurement performed by the time measuring unit, the first, second and third substrate transfer units forcibly transfers the respective substrates, which wait in the tape attaching unit, the component mounting unit, and the component compression unit, to their downstream sides and causes the component mounting unit and the component compression unit to perform predetermined works on the respective substrates that are forcibly transferred by the first and second substrate transfer units to the component mounting unit and the component compression unit.

According to some aspects of the present invention, when preparation for transferring the substrates to the tape attaching unit is not completed within a predetermined time after the start of measurement performed by the time measuring unit, the respective substrates, which wait in the tape attaching unit, the component mounting unit, and the component compression unit, are forcibly transferred to their downstream sides and predetermined works are performed on the respective substrates that are forcibly transferred to the component mounting unit and the component compression unit. Accordingly, it is possible to compress the component while suppressing the deterioration of the adhesive tape.

DETAILED DESCRIPTION OF THE EXEMPLARY EMBODIMENTS

The entire structure of a component mounting apparatus of the present invention will be described first with reference to FIG. 1. The component mounting apparatus 1 has a function of manufacturing a mounting substrate by compressing an electronic component (hereinafter, simply referred to as a "component") mounted on a substrate with an ACF tape interposed therebetween. The ACF tape is obtained by forming an anisotropic conductive film, which is a type of an adhesive tape, in the shape of a tape. Examples of the component include a drive circuit component that has a film-shaped portion.

Figure 1:
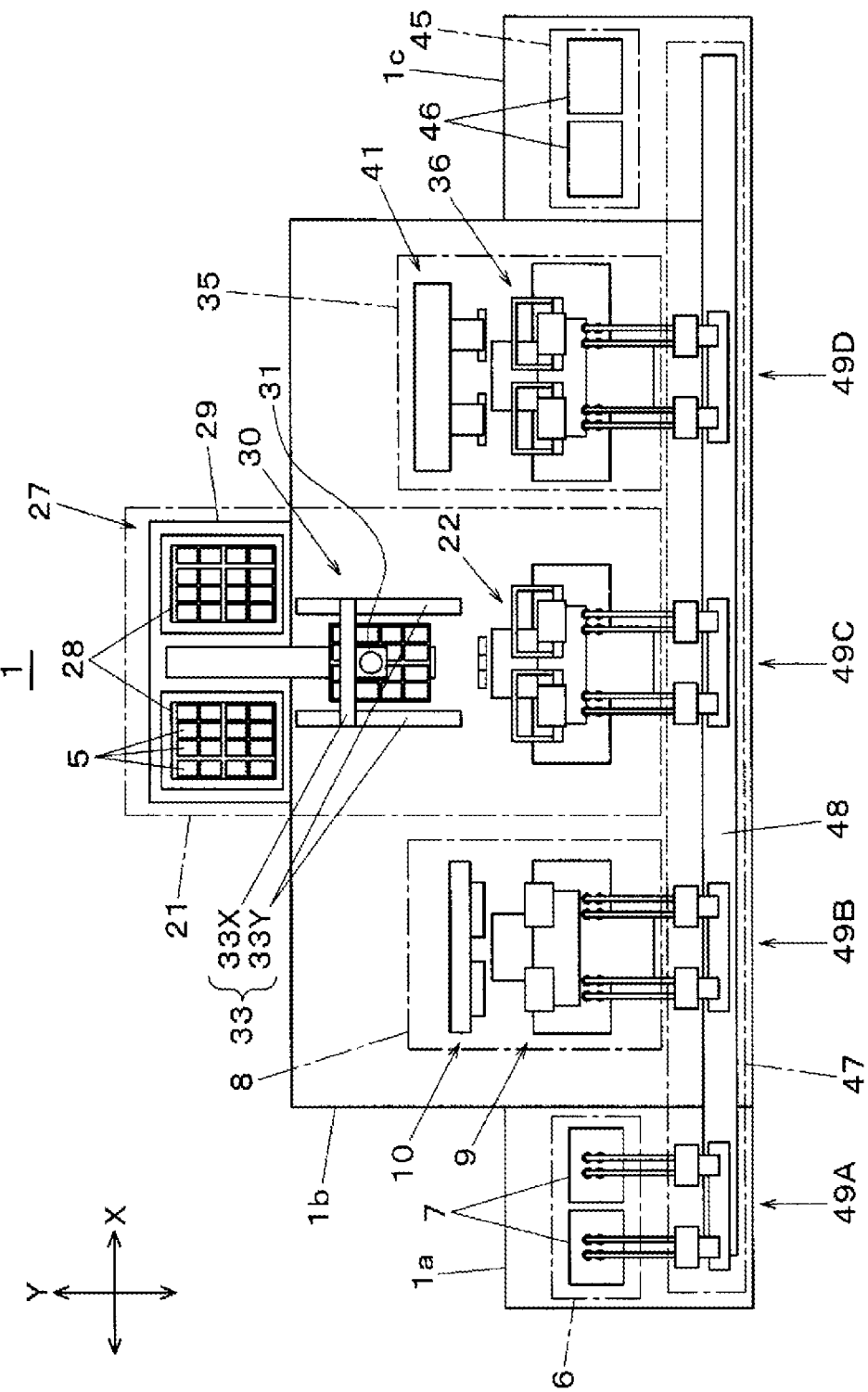
FIG. 1 is a plan view of a component mounting apparatus according to an embodiment of the present invention.

In FIG. 1, the component mounting apparatus 1 has a structure in which bases 1a, 1b, and 1c are arranged in one direction (X direction) on a horizontal plane, a substrate carrying-in unit 6 as a work unit is disposed on the base 1a, a tape attaching unit 8, a component mounting unit 21, and a component compression unit 35 as work units are disposed on the base 1b, a substrate carrying-out unit 45 as a work unit is disposed on the base 1c, and a substrate transfer mechanism 47 is disposed in an area in front of each work unit. Hereinafter, the side on which the substrate carrying-in unit 6 is disposed is referred to as an upstream side (the left side on the plane of paper) and the side on which the substrate carrying-out unit 45 is disposed is referred to as a downstream side (on the right side on the plane of paper). Further, a direction orthogonal to an X direction in a horizontal plane is referred to as a Y direction, and a direction perpendicular to an X-Y plane is referred to as a Z direction. Furthermore, among the above-mentioned five work units, the tape attaching unit 8, the component mounting unit 21, and the component compression unit 35 are referred to as "mounting work units".

In FIG. 1, the substrate carrying-in unit 6 is a work unit carrying in substrates 2 (FIGS. 2A and 2B) having been completely subjected to predetermined work by upstream facilities that are disposed on the upstream side of the component mounting apparatus 1. The substrate carrying-in unit 6 includes a plurality of (here, two) substrate holding tables 7. The plurality of substrate holding tables 7 are provided in parallel in the X direction, and are individually moved up and down relative to the base 1a by a table lift mechanism. The substrates 2, which are transferred from the upstream facility, are placed on the substrate holding tables 7 by upstream facility-transfer means, such as a transfer arm, included in the upstream facility.

In FIGS. 1 to 3C, the tape attaching unit 8 is a mounting work unit attaching an individual tape 4b1, which is obtained by cutting an ACF tape 4b (FIGS. 3A to 3C) into a predetermined length, to the substrate 2. The tape attaching unit 8 is provided at the upstream portion of the base 1b, and includes a substrate positioning mechanism 9 and an attaching mechanism 10 that is provided above the substrate positioning mechanism 9.

Figure 2A:
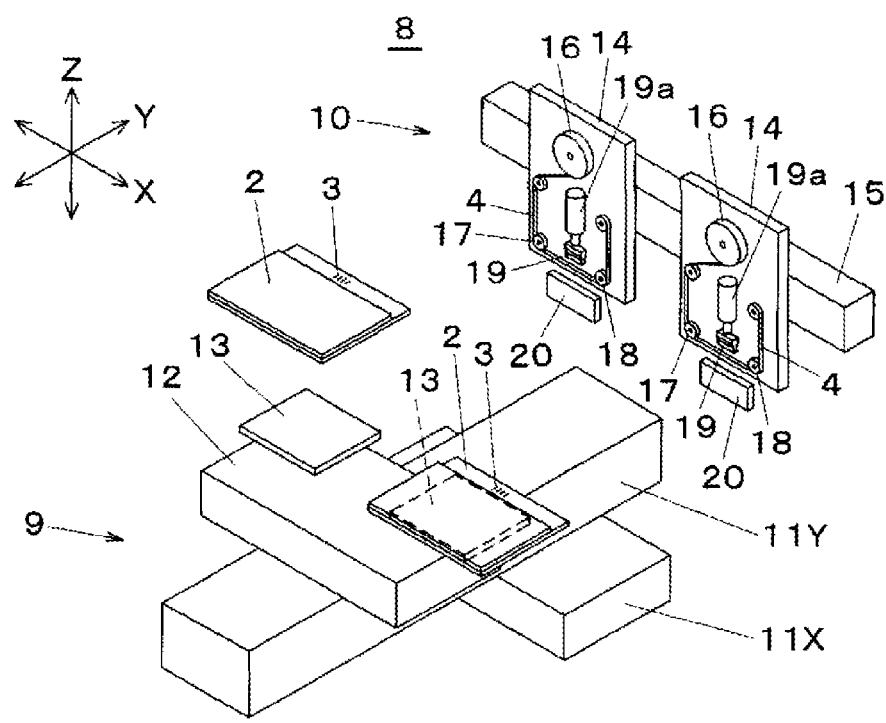
FIGS. 2A and 2B are perspective views of a tape attaching unit that is included in the component mounting apparatus according to the embodiment of the present invention.
Figure 2B:
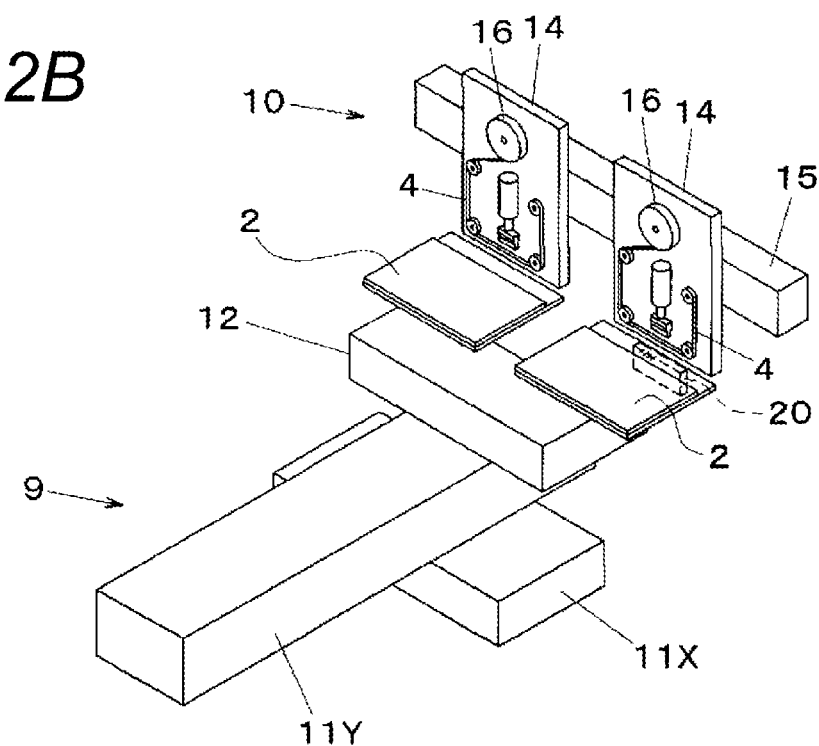

In FIGS. 2A and 2B, the substrate positioning mechanism 9 has a structure in which an X-axis table 11X and a Y-axis table 11Y are stacked and a moving stage 12 is provided on the Y-axis table 11Y. The Y-axis table 11Y is moved in the X direction by the driving of the X-axis table 11X. Further, the moving stage 12 is moved in the Y direction by the driving of the Y-axis table 11Y.

A plurality of (here, two) substrate holding tables 13 are provided on the moving stage 12 in parallel in the X direction, and hold the substrates 2 that are transferred from the substrate carrying-in unit 6. The respective substrate holding tables 13 are individually moved up and down relative to the moving stage 12 by the driving of the table lift mechanism. It is possible to move the substrates 2, which are held by the substrate holding tables 13, in the X direction, the Y direction, and the Z direction and to position the substrates 2 at predetermined positions by driving the X-axis table 11X, the Y-axis table 11Y, and the table lift mechanism.

The attaching mechanism 10 includes a plurality of (here, two) base plates 14 that are provided in parallel in the X direction. A plate moving mechanism 15, which extends in the X direction, is mounted on the rear surfaces of the respective base plates 14, and the respective base plates 14 are individually moved in the X direction by the driving of the plate moving mechanism 15.

Figure 3A:
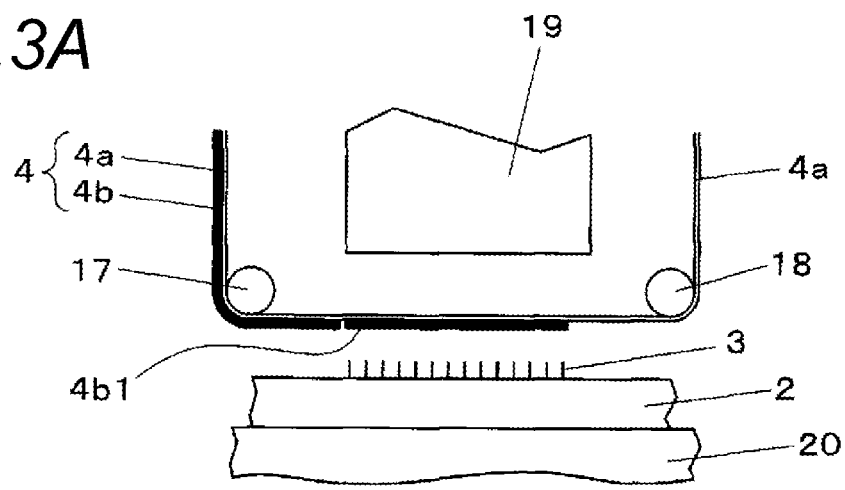
FIGS. 3A, 3B, and 3C illustrate tape attaching work according to the embodiment of the present invention.
Figure 3B:
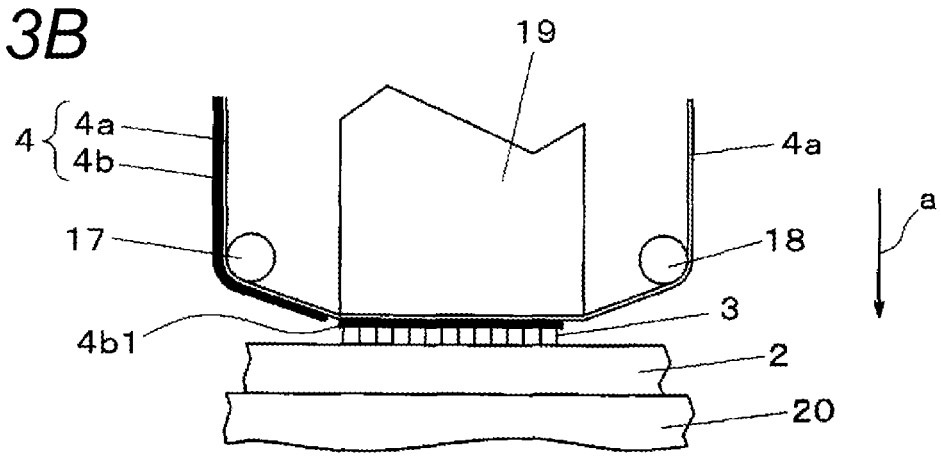
Figure 3C:
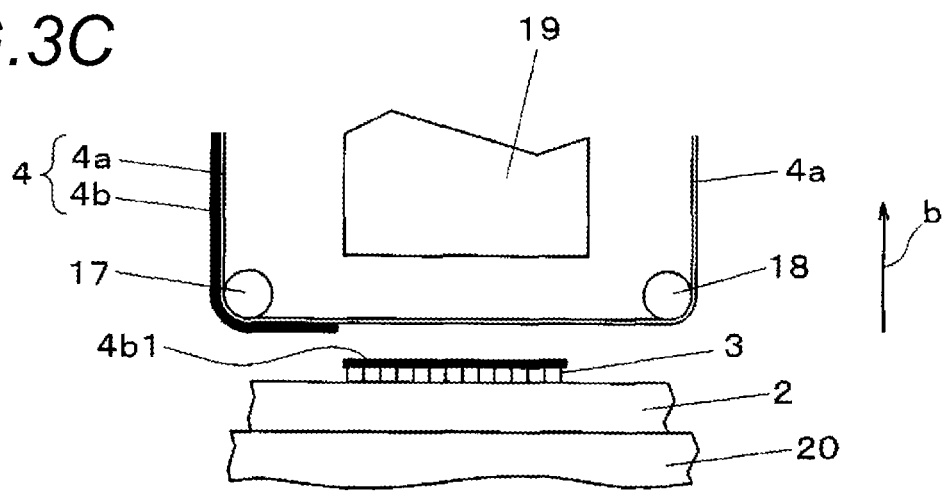

A tape feed reel 16 is detachably mounted at an upper position on the front surface of each of the base plates 14. A tape member 4 in which the ACF tape 4b is laminated on a separator 4a is wound and stored on the tape feed reel 16 as shown in FIGS. 3A to 3C, and the tape feed reel 16 is rotationally driven by a reel driving mechanism.

In FIGS. 2A to 3C, a first guide roller 17 and a second guide roller 18 are disposed at horizontal positions on both side portions of a lower end portion of the base plate 14. The tape member 4 surrounds the first guide roller 17 and is horizontally guided from the upstream side toward the downstream side while the ACF tape 4b faces the lower side.

A compression tool 19, which is moved up and down by a tool lift mechanism 19a, is provided above a horizontal feed path for the tape member 4 between the two guide rollers 17 and 18. A cutter unit, which cuts the ACF tape 4b according to the length of an electrode portion 3 of the substrate 2, is provided at a position on the upstream side of the compression tool 19. The individual tape 4b1, which is cut into a predetermined length by the cutter unit, is fed below the compression tool 19. The tape member 4 of which only the separator 4a remains after the individual tape 4b1 is attached to the substrate 2 surrounds the second guide roller 18, is guided to the upper side, and is collected in a tape collecting unit.

In FIGS. 2A to 3C, a backup stage 20, which has a horizontal surface extending in the X direction, is provided below the compression tool 19. The backup stage 20 supports an edge portion of the substrate 2, at which the electrode portion 3 is formed, from below.

In tape attaching work, first, as shown in FIG. 2B, the substrate positioning mechanism 9 is driven to move the moving stage 12 in a predetermined direction so that edge portions of the substrates 2 held by the plurality of substrate holding tables 13 are positioned above the backup stages 20. After that, as shown in FIGS. 3A and 3B, the compression tool 19 is moved down (arrow a) while the individual tape 4b1 is positioned above the electrode portion 3 of the substrate 2. Accordingly, the individual tape 4b1 is pressed against and attached to the electrode portion 3. After the individual tape 4b1 is attached, the compression tool 19 is moved up as shown in FIG. 3C (arrow b). Meanwhile, the plate moving mechanism 15 may be driven to move the base plate 14 in the X direction, so that the substrate 2 and the compression tool 19 may be positioned.

Figure 4A:
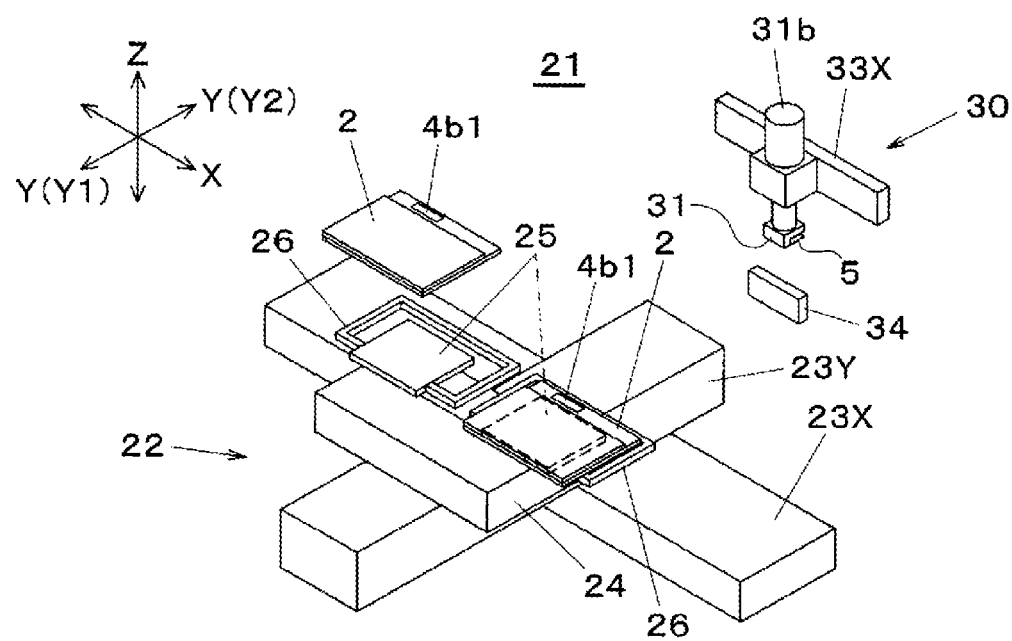
FIGS. 4A and 4B are perspective views of a component mounting unit that is included in the component mounting apparatus according to the embodiment of the present invention.
Figure 4B:
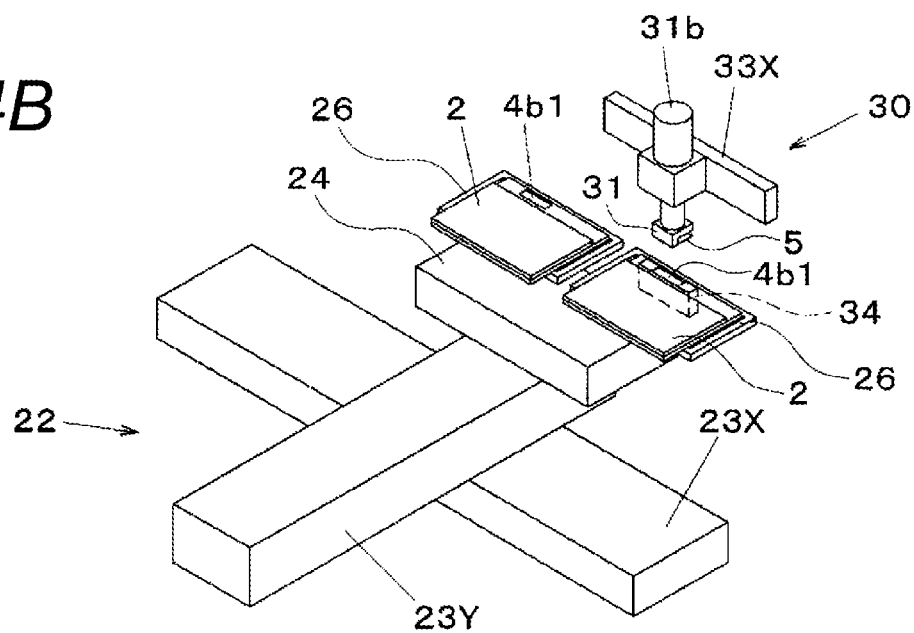

In FIG. 1 and FIGS. 4A and 4B, the component mounting unit 21 is a mounting work unit that is provided on the downstream side of the tape attaching unit 8 and mounts a component 5 on the individual tape 4b1 attached to the substrate 2. The component mounting unit 21 includes a substrate positioning mechanism 22, a component feed mechanism 27 that is provided on the rear side of the substrate positioning mechanism 22, and a component mounting mechanism 30 that is provided between the substrate positioning mechanism 22 and the component feed mechanism 27.

In FIGS. 4A and 4B, similar to the substrate positioning mechanism 9, the substrate positioning mechanism 22 has a structure in which an X-axis table 23X and a Y-axis table 23Y are stacked and a moving stage 24 is provided on the upper surface of the Y-axis table 23Y. A plurality of (here, two) substrate holding tables 25 are provided on the upper surface of the moving stage 24 in parallel in the X direction, and hold the substrates 2 that are transferred from the tape attaching unit 8. The respective substrate holding tables 25 are individually moved up and down relative to the moving stage 24 by a stage lift mechanism. It is possible to move the substrates 2, which are held by the substrate holding tables 25, in the X direction, the Y direction, and the Z direction and to position the substrates 2 at predetermined positions by driving the X-axis table 23X, the Y-axis table 23Y, and the stage lift mechanism.

In FIGS. 4A to 5C, the substrate holding table 25 is provided with a frame-like member 26 that includes a contact portion 26a extending in the X direction on the rear side of the substrate holding table 25 (Y2 side). The frame-like member 26 supports a film-shaped portion 5a from below while the film-shaped portion 5a comes into contact with the contact portion 26a when a component is mounted. Accordingly, the sag of the film-shaped portion 5a is prevented.

In FIG. 1, the component feed mechanism 27 includes a tray holder 29 in which trays 28 storing a plurality of components 5 are stacked and which holds the trays 28. One tray, which is held by the tray holder 29, is taken out of the tray holder 29 by a tray transfer mechanism, and is transferred to a predetermined component feed position.

Figure 5A:
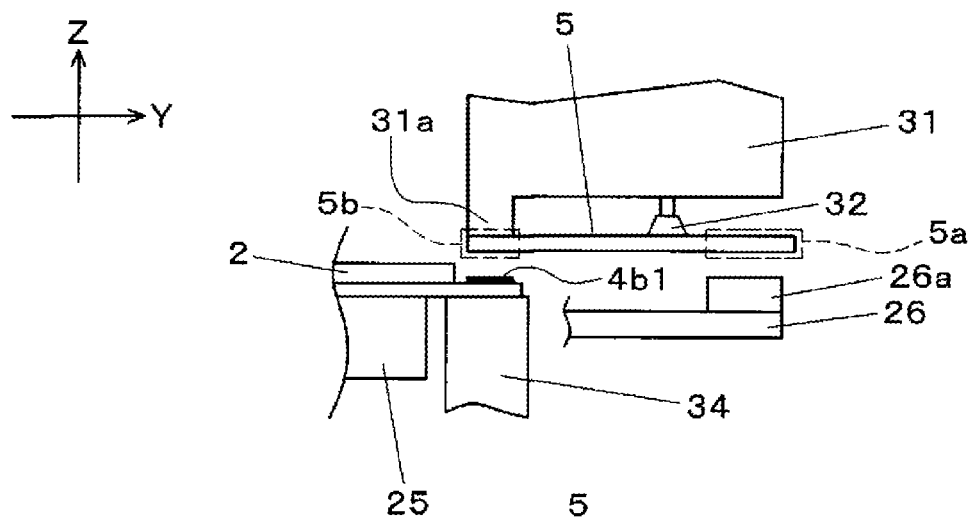
FIGS. 5A, 5B, and 5C illustrate component mounting work of the embodiment of the present invention.
Figure 5B:
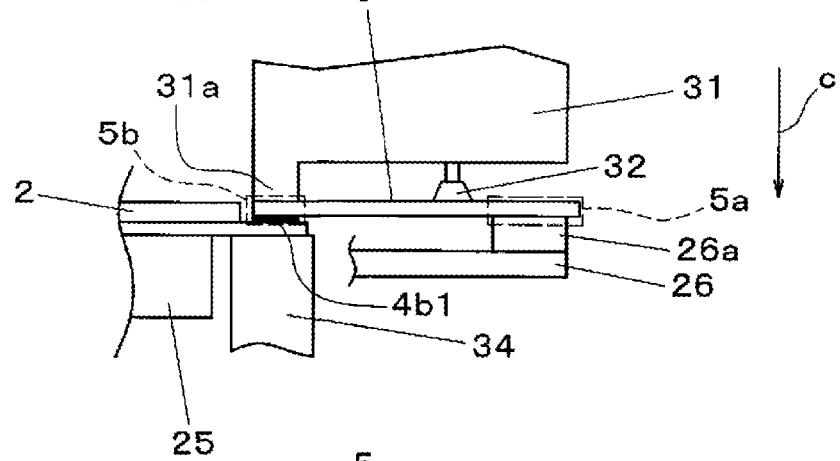
Figure 5C:
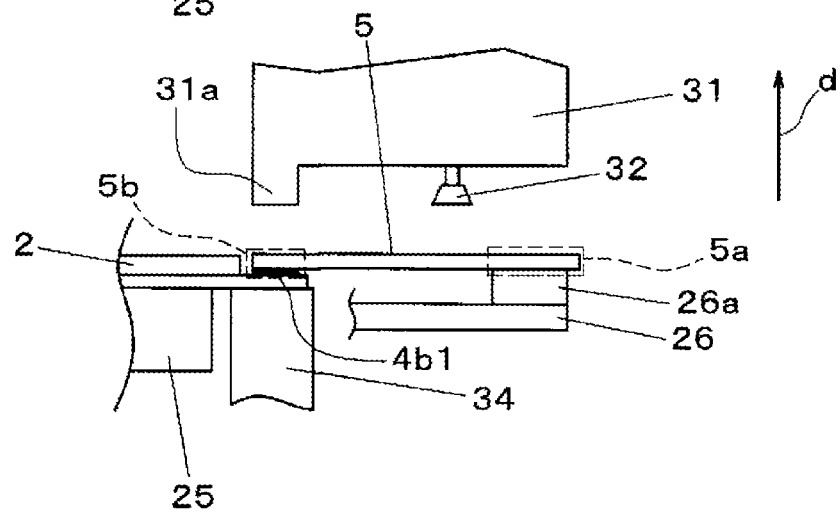

In FIGS. 1, 4A, and 4B, the component mounting mechanism 30 includes a mounting head 31 and a head moving mechanism 33. In FIGS. 5A to 5C, a contact portion 31a with which a connection portion 5b of the component 5 to be connected to the electrode portion 3 with the individual tape 4b1 interposed therebetween comes into contact and a suction nozzle 32 having a suction surface, which is set to the same height as the height of the lower surface of the contact portion 31a, are provided on the lower surface of the mounting head 31. The mounting head 31 is moved up and down by a head lift mechanism 31b, and sucks and holds the component 5 by the suction nozzle 32 while the connection portion a of the component 5 comes into contact with the contact portion 31a.

In FIG. 1, the head moving mechanism 33 is to move the mounting head 31 in the X direction and the Y direction and includes two Y-axis tables 33Y and an X-axis table 33X that is installed on the Y-axis tables 33Y and is movable in the Y direction. The mounting head 31 is mounted on the X-axis table 33X so as to be movable in the X direction, and is moved in the X direction and the Y direction above the tray 28, which is transferred to the component feed position, by the driving of the Y-axis tables 33Y and the X-axis table 33X.

In FIGS. 4A and 4B, a backup stage 34 having a horizontal surface is provided at a predetermined position in a moving area of the mounting head 31 on the rear side of the substrate positioning mechanism 22. The backup stage 34 supports an edge portion, to which the individual tape 4b1 is attached, of the substrate 2 from below.

In component mounting work, first, as shown in FIG. 4B, the substrate positioning mechanism 22 is driven to move the moving stage 24 in a predetermined direction so that an edge portion of the substrate 2 held by each substrate holding table 25 is positioned above the backup stage 34. After that, one tray 28 is transferred to a component feed position and the mounting head 31 is moved to a position above the tray 28. Then, after a component 5 is taken out of the tray 28 by the mounting head 31, the contact portion 31a is positioned above the electrode portion 3, to which the individual tape 4b1 is attached, of one positioned substrate 2 as shown in FIG. 5A.

After that, as shown in FIG. 5B, the mounting head 31 is moved down (arrow c) and the component 5 is mounted on the substrate 2 with the individual tape 4b1 interposed therebetween. At this time, the film-shaped portion 5a of the component 5 is supported from below by the contact portion 26a of the frame-like member 26. Then, when the mounting head 31 is moved up (arrow d) as shown in FIG. 5C, the component mounting work performed on one substrate 2 is ended. Further, the mounting head 31 is moved to a position above the tray 28 again, takes out a component 5, and mounts the component 5 on another substrate 2.

Figure 6A:
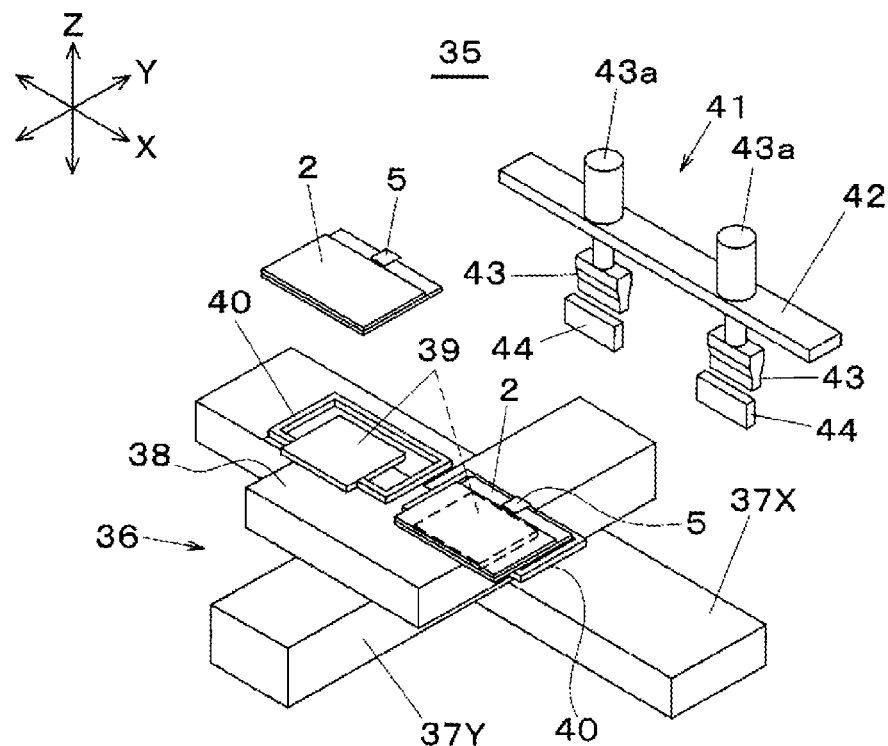
FIGS. 6A and 6B are perspective views of a component compression unit that is included in the component mounting apparatus according to the embodiment of the present invention.
Figure 6B:
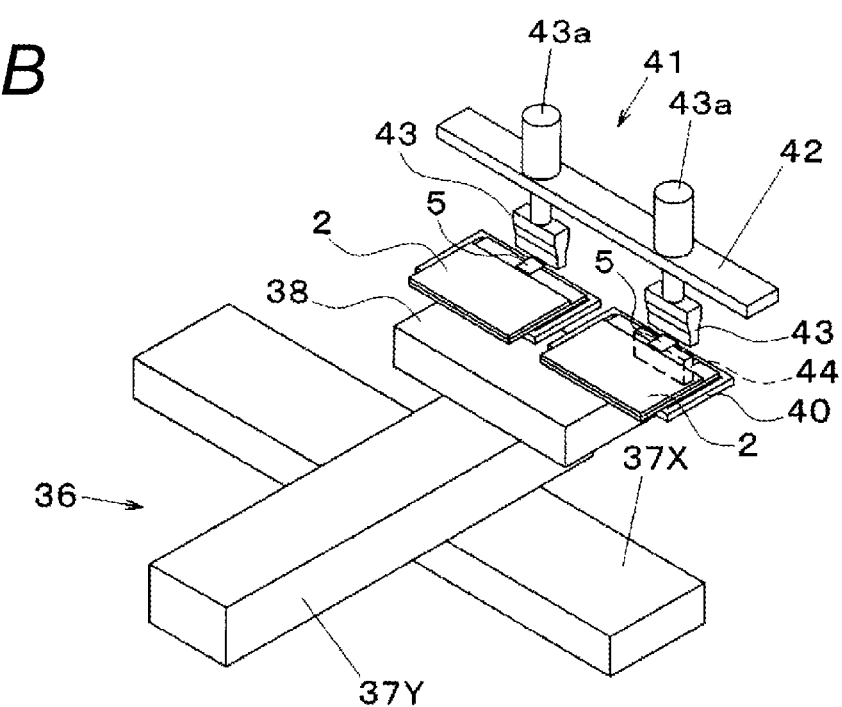

In FIGS. 1, 6A, and 6B, the component compression unit 35 is a mounting work unit that is provided on the downstream side of the component mounting unit 21 and compresses the component 5 mounted on the substrate 2. The component compression unit 35 includes a substrate positioning mechanism 36 and a compression mechanism 41 that is provided above the substrate positioning mechanism 36.

In FIGS. 6A and 6B, similar to the substrate positioning mechanisms 9 and 22, the substrate positioning mechanism 36 has a structure in which an X-axis table 37X and a Y-axis table 37Y are stacked and a moving stage 38 is provided on the Y-axis table 37Y. A plurality of (here, two) substrate holding tables 39 are provided on the upper surface of the moving stage 38 in parallel in the X direction, and hold the substrates 2 that are transferred from the component mounting unit 21. The respective substrate holding tables 39 are individually moved up and down relative to the moving stage 38 by a table lift mechanism. It is possible to move the substrates 2, which are held by the substrate holding tables 39, in the X direction, the Y direction, and the Z direction by driving the X-axis table 37X, the Y-axis table 37Y, and the table lift mechanism.

In FIGS. 6A to 7C, the substrate holding table 39 is provided with a frame-like member 40 that includes a contact portion 40a extending in the X direction on the rear side of the substrate holding table 39. The frame-like member 40 supports the film-shaped portion 5a from below while the film-shaped portion 5a comes into contact with the contact portion 40a when the substrate 2 is held by the substrate holding table 39.

The compression mechanism 41 has a structure in which a plurality of (here, two) compression tools 43 are provided below a plate member 42 extending in the X direction so as to be movable up and down. Tool lift mechanisms 43a are mounted on the upper surface of the plate member 42, and the compression tools 43 are moved up and down by the driving of the tool lift mechanisms 43a. Backup stages 44 having horizontal surfaces are provided at positions below the compression tools 43. The backup stage 44 supports an edge portion, on which the component 5 is mounted, of the substrate 2 from below.

Figure 7A:
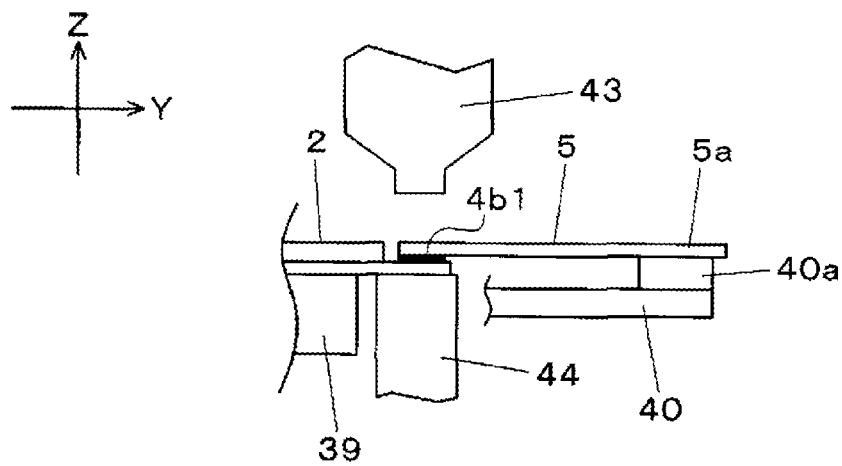
FIGS. 7A, 7B, and 7C illustrate component compression work of the embodiment of the present invention.
Figure 7B:
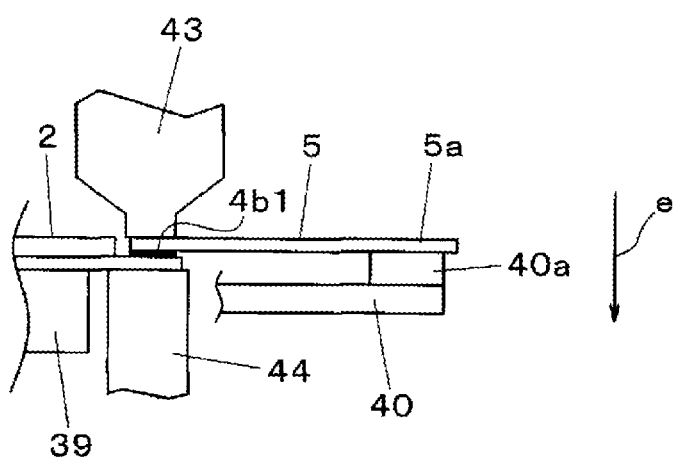
Figure 7C:
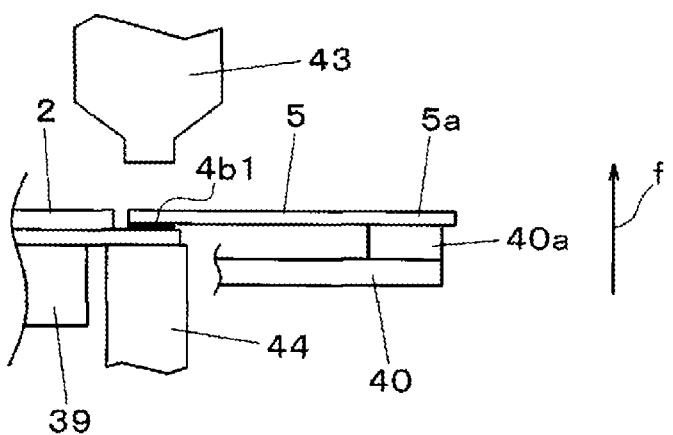

In component compression work, first, as shown in FIG. 6B, the substrate positioning mechanism 36 is driven to move the moving stage 38 in a predetermined direction so that edge portions of the substrates 2 held by the respective substrate holding tables 39 are positioned above the backup stages 44. After that, as shown in FIGS. 7A and 7B, the compression tool 43 is moved down (arrow e) from above the component 5 mounted on the substrate 2 and compresses the component 5 to the substrate 2. Meanwhile, the respective compression tools 43 may be simultaneously moved down onto two substrates 2, and may be continuously moved down. After pressing and bonding the component 5, the compression tool 43 is moved up (arrow f) as shown in FIG. 7C.

In FIG. 1, the substrate carrying-out unit 45 is a work unit carrying out substrates 2, which have been completely subjected to the component compression work by the component compression unit 35, from the component mounting apparatus 1. The substrate carrying-out unit 45 includes a plurality of (here, two) substrate holding tables 46. The respective substrate holding tables 46 are provided in parallel in the X direction, and are individually moved up and down relative to the base 1c by a table lift mechanism. The substrates 2, which are transferred from the component compression unit 35, are placed on the substrate holding table 46. Substrates 2 placed on the substrate holding tables 46 are carried to a downstream facility by downstream facility-transfer means, such as a transfer arm, included in the downstream facility provided on the downstream of the component mounting apparatus 1.

Figure 8:
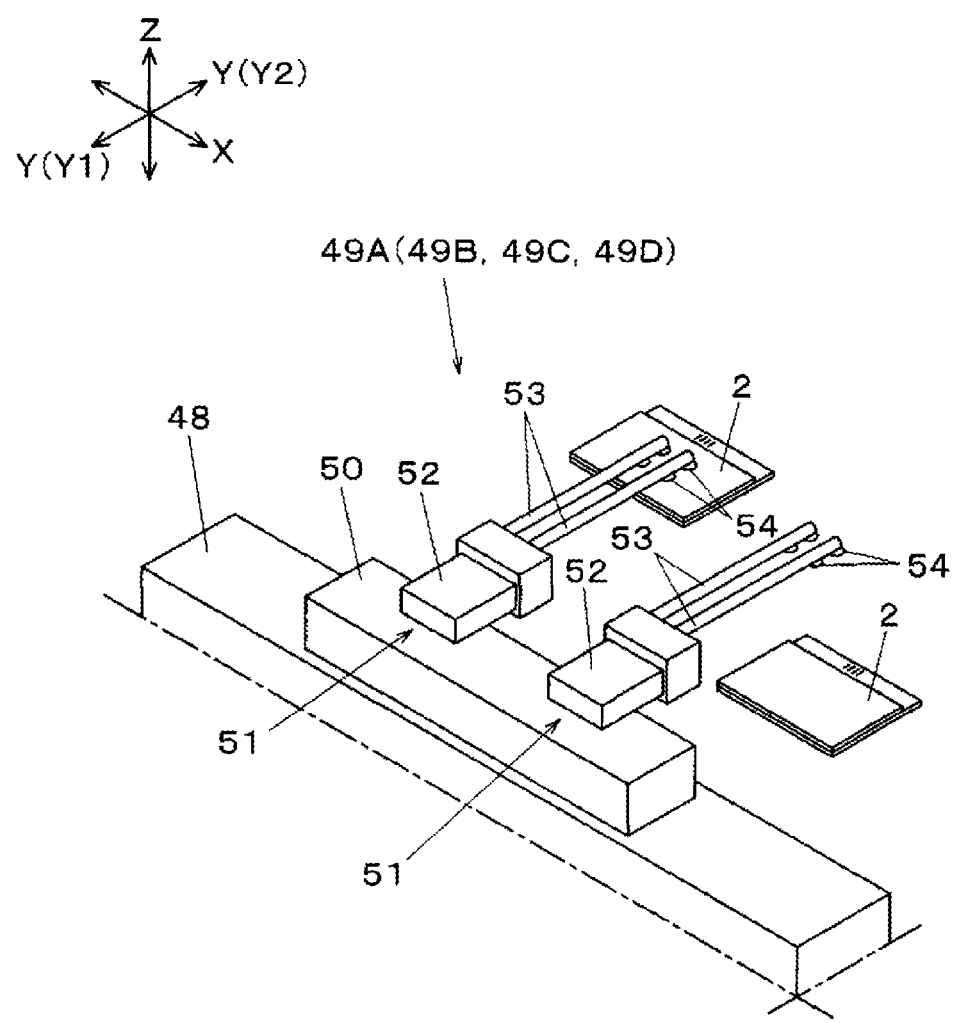
FIG. 8 is a partial perspective view of a substrate transfer unit that is included in the component mounting apparatus according to the embodiment of the present invention.

In FIGS. 1 and 8, the substrate transfer mechanism 47 is a transfer work unit that transfers (delivers) the substrate 2 between the work units, and includes an X-axis table 48 that extends in the X direction over the front area of the bases 1a, 1b, and 1c. A first substrate transfer mechanism 49A, a second substrate transfer mechanism 49B, a third substrate transfer mechanism 49C, and a fourth substrate transfer mechanism 49D are provided on the X-axis table 48 in this order from the upstream side. These substrate transfer mechanisms 49A to 49D are moved in the X direction in synchronization with each other by the driving of the X-axis table 48.

In FIG. 8, each of the substrate transfer mechanisms 49A to 49D includes a base part 50 that is mounted on the X-axis table 48 so as to be movable in the X direction and a plurality of (here, two) arm units 51 that are provided on the base part 50 in parallel in the X direction. Each of the arm units 51 includes an arm base 52 that is fixed to the base part 50 and a pair of arms 53 that extends rearward from the arm base 52. Since the arms 53 are provided with a plurality of suction pads 54 of which suction surfaces face the lower side (one arm 53 is provided with two suction pads 54), each of the arm units sucks and holds the substrate 2 by a total of four suction pads 54 of the pair of arms 53.

Figure 9:
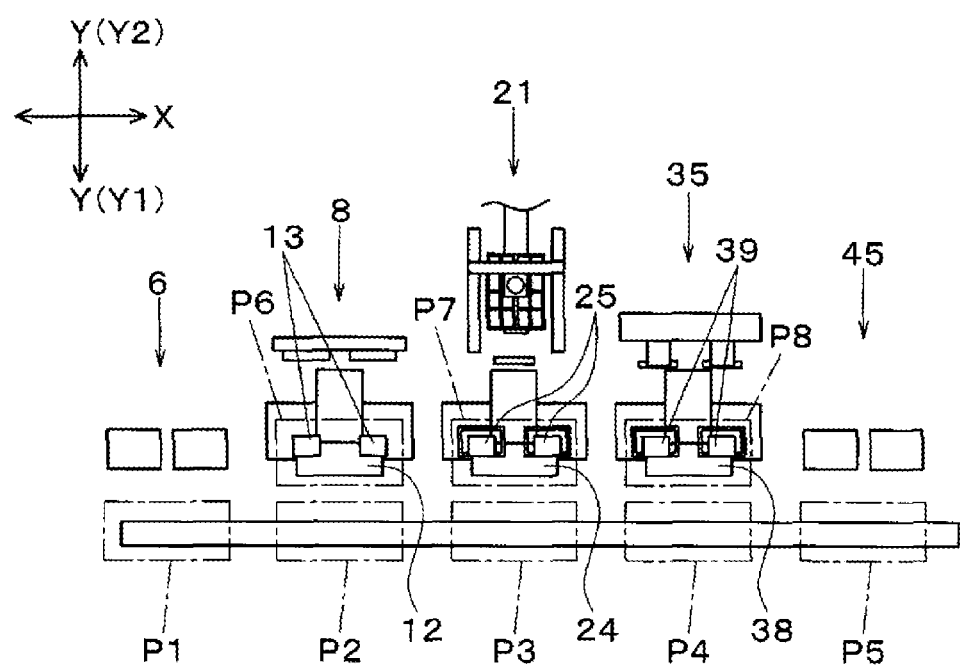
FIG. 9 is a plan view of the component mounting apparatus according to the embodiment of the present invention.

In FIG. 9, the first substrate transfer mechanism 49A is moved between a first position P1 that is present on the front side of the substrate carrying-in unit 6 (Y1 side) and a second position P2 that is present on the front side of the tape attaching unit 8. The second substrate transfer mechanism 49B is moved between the second position P2 and a third position P3 that is present on the front side of the component mounting unit 21. The third substrate transfer mechanism 49C is moved between the third position P3 and a fourth position P4 that is present on the front side of the component compression unit 35. The fourth substrate transfer mechanism 49D is moved between the fourth position P4 and a fifth position P5 that is present on the front side of the substrate carrying-out unit 45.

When the substrates 2 are transferred by the mounting work units, the moving stages 12, 24, and 38 are moved in the Y1 direction and the substrates 2 are positioned at a sixth position P6, a seventh position P7, and an eighth position P8 where the substrates 2 can be transferred on the substrate holding tables 13, 25, and 39 by the arms 53. Each of the sixth position P6, the seventh position P7, and the eighth position P8 is a substrate transfer position where the transfer of the substrates 2 is performed between the adjacent work units.

Figure 10A:
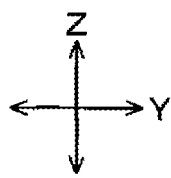
FIGS. 10A, 10B, and 10C illustrate substrate transfer work of the embodiment of the present invention.
Figure 10A:
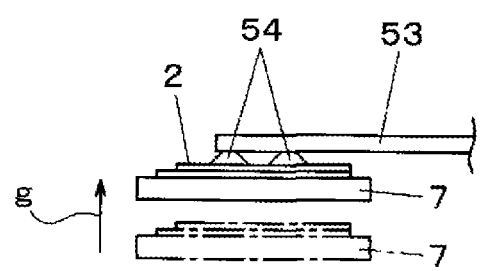
Figure 10B:
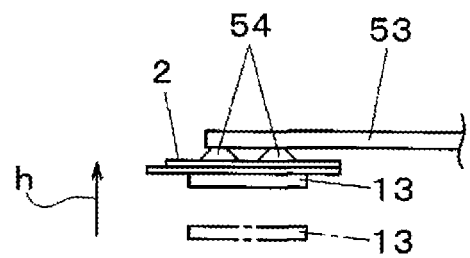
Figure 10C:
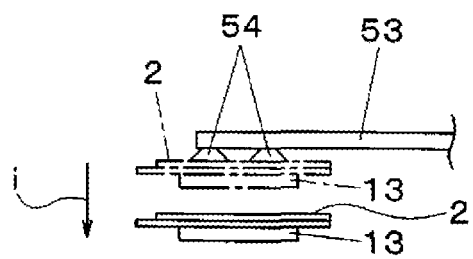

Next, transfer work for the substrate 2, which is performed between the work units, will be described with reference to FIGS. 10A, 10B, and 10C. Here, the transfer of the substrates 2 between the substrate carrying-in unit 6 and the tape attaching unit 8 will be described by way of example. First, as shown in FIG. 10A, the substrate holding tables 7, which hold the substrate 2, are moved up (arrow g) and the substrates 2 come into contact with the suction pads 54 of the arms 53 of the first substrate transfer mechanism 49A moved to the first position P1. Then, after the substrates 2 are sucked by the suction pads 54, the substrate holding tables 7 are moved down and the first substrate transfer mechanism 49A is moved to the second position P2 in such a state. After that, as shown in FIG. 10B, the substrate holding tables 13 provided on the moving stage 12 moved to the sixth position P6 are moved up (arrow h) and come into contact with the substrates 2 that are sucked by the suction pads 54. Then, after the suction caused by the suction pads 54 is cancelled, the substrate holding tables 13 are moved down as shown in FIG. 10C (arrow i). The transfer of the substrates 2 between the other work units is also performed by the same method.

Figure 11:
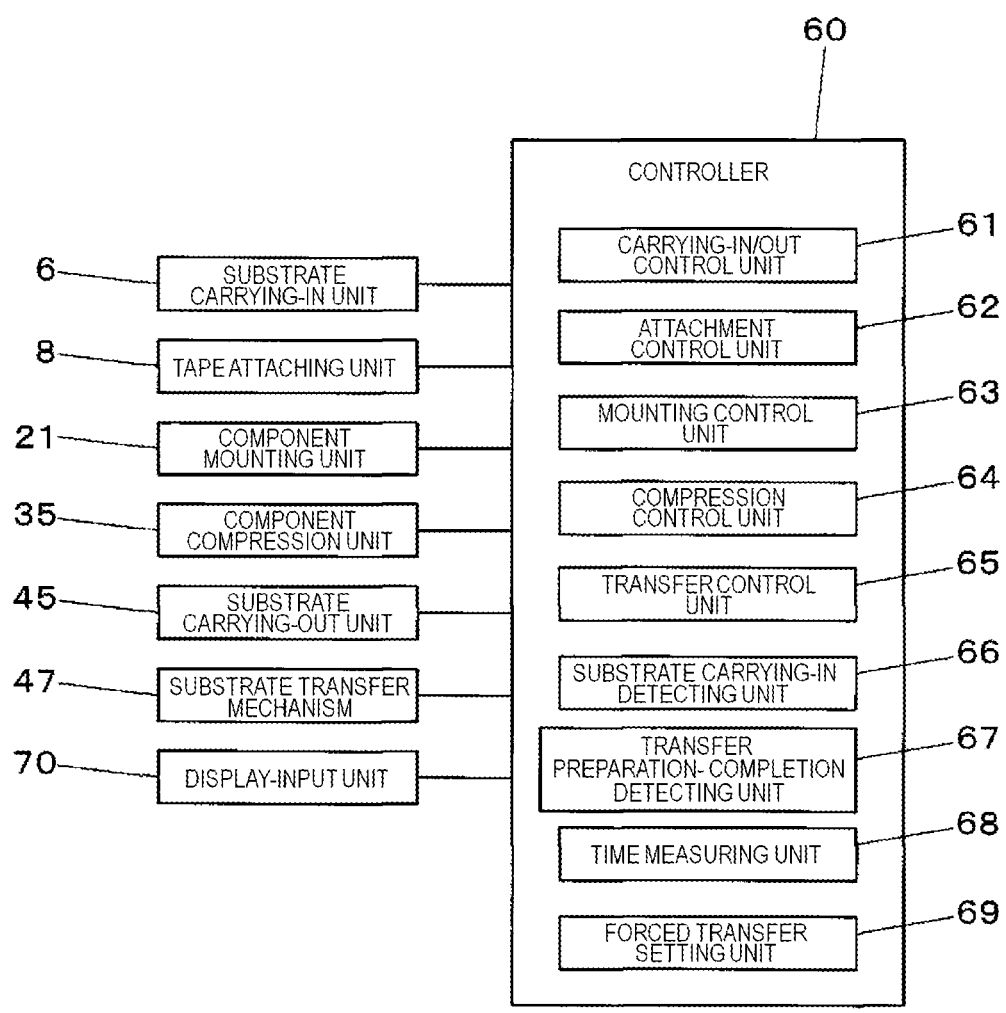
FIG. 11 is a block diagram showing the configuration of a control system for the component mounting apparatus according to the embodiment of the present invention.

Next, the configuration of the control system for the component mounting apparatus 1 will be described with reference to FIG. 11. A controller 60 included in the component mounting apparatus 1 has an arithmetic processing function, and includes a carrying-in/out control unit 61, an attachment control unit 62, a mounting control unit 63, a compression control unit 64, a transfer control unit 65, a substrate carrying-in detecting unit 66, a transfer preparation-completion detecting unit 67, a time measuring unit 68, and a forced transfer setting unit 69. Further, the controller 60 is connected to the substrate carrying-in unit 6, the tape attaching unit 8, the component mounting unit 21, the component compression unit 35, the substrate carrying-out unit 45, the substrate transfer mechanism 47, and the display-input unit 70.

The carrying-in/out control unit 61 allows the substrate holding tables 7 of the substrate carrying-in unit 6 and the substrate holding tables 46 of the substrate carrying-out unit 45 to be moved up and down by controlling the table lift mechanisms. The attachment control unit 62 performs the tape attaching work by controlling the respective mechanisms of the tape attaching unit 8. The mounting control unit 63 performs the component mounting work by controlling the respective mechanisms of the component mounting unit 21. The compression control unit 64 performs the component compression work by controlling the respective mechanisms of the component compression unit 35. Meanwhile, pieces of predetermined work of the respective mounting work units are simultaneously performed in parallel.

The transfer control unit 65 performs the transfer of the substrates 2 between the work units by controlling the respective mechanisms of the substrate transfer mechanism 47. The transfer control unit 65 transfers the substrates 2 in compliance with any one of a "normal transfer mode" and a "forced transfer mode" according to a setting state of forced transfer, a transfer state of the substrate 2 between the work units, or the like. Details of the forced transfer and the respective transfer modes will be described below.

The substrate carrying-in detecting unit 66 detects whether or not the substrates 2 are carried into the substrate carrying-in unit 6. The detection performed here is performed on the basis of various methods, such as the up and down movement of the substrate holding tables 7, a signal that is sent from an upstream facility when the substrates 2 are carried from the upstream facility, and a result of the detection of the substrates 2 that is performed by substrate detecting means such as a pressure sensor built in the substrate holding table 7. When the carrying-in of the substrates 2 is detected by the substrate carrying-in detecting unit 66, the transfer control unit 65 determines that preparation for transferring the substrates 2 to the tape attaching unit 8 is completed in the substrate carrying-in unit 6.

The transfer preparation-completion detecting unit 67 detects a "transfer preparation completion timing" at which preparation for transferring the substrates 2 to the downstream side is completed in each mounting work unit. That is, the transfer preparation-completion detecting unit 67 detects a timing, at which the moving stage 12 is positioned at the sixth position P6 after the individual tape 4b1 is attached to the substrate 2, as the transfer preparation completion timing in the tape attaching unit 8; detects a timing, at which the moving stage 24 is positioned at the seventh position P7 after the component 5 is mounted on the substrate 2, as the transfer preparation completion timing in the component mounting unit 21; and detects a timing, at which the moving stage 38 is positioned at the eighth position P8 after the component 5 is compressed to the substrate 2, as the transfer preparation completion timing in the component compression unit 35. As described above, the transfer preparation-completion detecting unit 67 detects timings at which various kinds of mounting work (the tape attaching work, the component mounting work, and component compression work) have been completely performed in the respective mounting work units and preparation for transferring the substrates 2 to the downstream side has been completed.

The time measuring unit 68 measures time having passed from timings at which the moving stages 12, 24, and 38 holding the substrates 2, which have been completely subjected to various kinds of mounting work in the respective mounting work units, are moved to the substrate transfer positions (P6, P7, and P8), that is, the timings at which preparation for transferring the substrates 2 to the downstream side has been completed. Here, the time measuring unit 68 measures time having passed from the timing, which is detected last, among the transfer preparation completion timings of the respective mounting work units that are detected by the transfer preparation-completion detecting unit 67. For example, when preparation for transferring the substrates 2 in the tape attaching unit 8 and the component mounting unit 21 has been completed, the time measuring unit 68 measures time having passed from the timing at which preparation for transferring the substrates 2 has been completed in the component compression unit 35.

As described above, the time measuring unit 68 measures time having passed after predetermined work to be performed on all the substrates 2 transferred to the tape attaching unit 8, the component mounting unit 21, and the component compression unit 35 has been completed. Further, the "predetermined work" means preparation for transferring the substrates 2, which have been completely subjected to various kinds of mounting work in the respective mounting work units, to the downstream side. When forced transfer to be described below is effective and preparation for transferring the substrates 2 has not been completed in the substrate carrying-in unit 6 although preparation for transferring the substrates 2 has been completed in all the mounting work units, the time measuring unit 68 starts. That is, the time measured by the time measuring unit 68 means waiting time that has passed until preparation for transferring the substrates 2 is completed in the substrate carrying-in unit 6 (hereinafter, referred to as "upstream waiting time"). When preparation for transferring the substrates 2 has been completed in the substrate carrying-in unit 6 or when forced transfer is performed, the measurement of time is cleared (cancelled).

The forced transfer setting unit 69 sets conditions that are required when the forced transfer of the substrates 2 is performed. The forced transfer means a method of transferring the substrates 2, which have been completely subjected to preparation for transfer in each mounting work unit, to the downstream side when preparation for transferring the substrates 2 is not completed in the substrate carrying-in unit 6 within a predetermined time after the start of the measurement of time performed by the time measuring unit 68. Conditions to be set include the setting of the presence/absence of forced transfer and time that has passed until forced transfer is performed after the start of the measurement of time. The display-input unit 70 is display-input means such as a touch panel, and displays operation screens or various kinds of information that are necessary for the operation of the component mounting apparatus 1. Further, the display-input unit 70 displays a guide screen that is necessary when conditions of the forced transfer of the substrates 2 are set.

Figure 12:
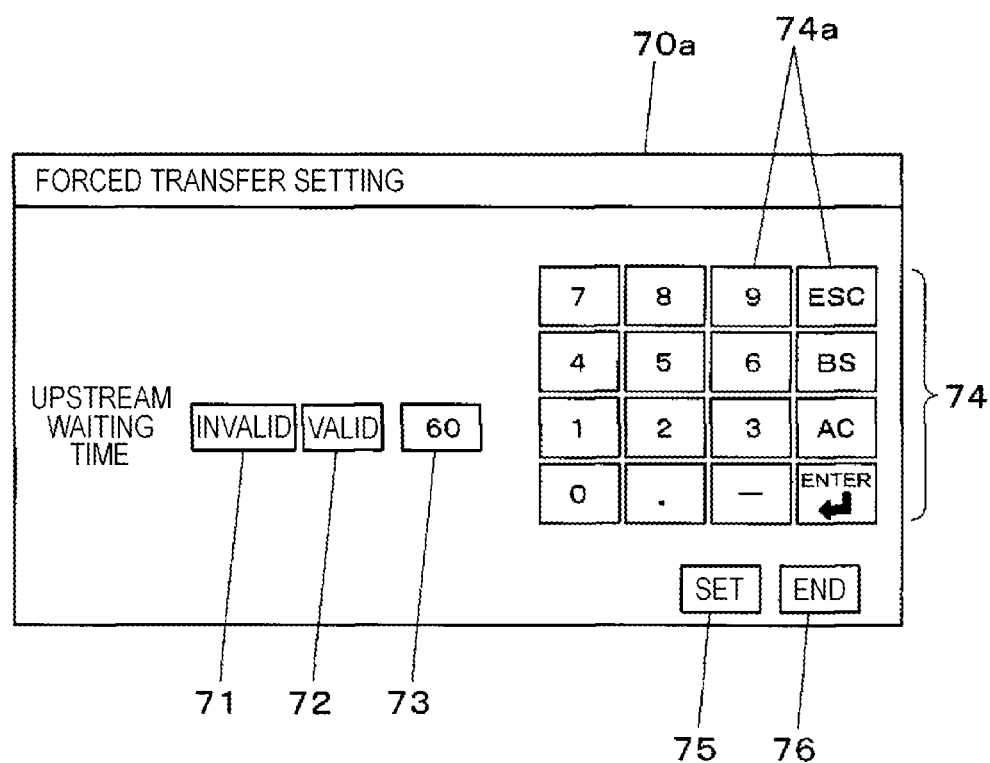
FIG. 12 shows a forced transfer setting screen displayed on a display-input unit that is included in the component mounting apparatus according to the embodiment of the present invention.

Next, a method of setting conditions of the forced transfer will be described with reference to FIG. 12. FIG. 12 shows a guide screen 70a that is displayed on the display-input unit 70 when the forced transfer setting unit 69 starts. Information, which includes "invalid" 71, "valid" 72, a "time input field" 73, and a "keypad" 74, is displayed on the guide screen 70a. The "invalid" 71 is an operation switch that makes the forced transfer invalid, and the "valid" 72 is an operation switch that makes the forced transfer valid.

When the forced transfer is made valid, time, which has passed until forced transfer is performed after the start of the measurement of time performed by the time measuring unit 68, is input to the "time input field" 73. That is, time while the transfer of the substrates 2, which have been completely subjected to preparation for transferring the substrates 2 to the downstream side in each mounting work unit, can be suspended, that is, time while the state of the component 5, which is not subjected to compression, of the substrate 2 to which the individual tape 4b1 is attached by the tape attaching unit 8 is allowable (hereinafter, referred to as "allowed time") is input to the "time input field" 73. The allowed time is arbitrarily set according to characteristics of the ACF tape 4b by an operator.

The ACF tape 4b will be described here. The ACF tape 4b has adhesion, and functions as a joining material that joins the substrate 2 to the component 5. Further, when the component 5 and the electrode portion of the substrate 2 are thermally compressed to each other with the ACF tape 4b interposed therebetween, only a thermally compressed portion of the ACF tape 4b has conductivity. Accordingly, the ACF tape 4b functions as a conductive member that obtains conduction between the component 5 and the electrode portion of the substrate 2. The ACF tape 4b gradually deteriorates and the above-mentioned adhesion or conductivity is affected under a normal temperature environment in the component mounting apparatus 1 including a state in which the tape feed reels 16 are mounted on the base plates 14. As a result, it is considered that the joining quality of the component 5 is lowered. That is, since the available time of the ACF tape 4b under the normal temperature environment is limited, the compression of the component 5 needs to be quickly performed on the substrate 2, to which the individual tape 4b1 is attached, before the individual tape 4b 1 deteriorates.

An operator inputs time (available time), in which it is assumed that the individual tape 4b1 attached to the substrate 2 by the tape attaching unit 8 has constant adhesion, to the "time input field" 73 as the allowed time. For example, when a low-temperature curing ACF tape 4b is used, the available time of the ACF tape 4b under a normal temperature environment is shorter than the available time of a usual ACF tape under a normal temperature environment. Accordingly, the allowed time is set to be short.

The "keypad" 74 functions as an input unit on which a plurality of various input keys 74a used to input an intended numeral to the "time input field" 73 are arranged, and allowed time is input through the "keypad" 74. The setting of the conditions of the forced transfer is performed by operating (clicking) any one of the "invalid" 71 and the "valid" 72 and operating "setting" 75 displayed on the screen after intended allowed time is input when the "valid" 72 is selected. "End" 76 is operated to end the guide screen 70a.

Figure 13:
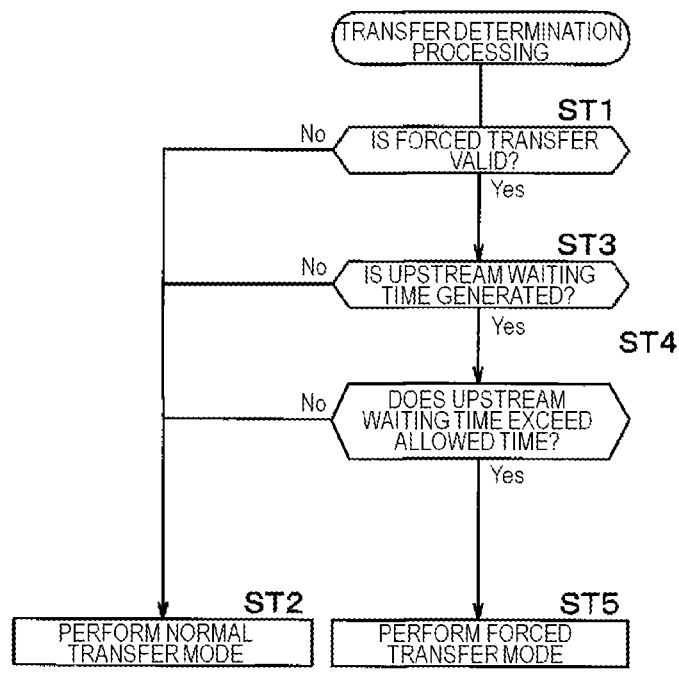
FIG. 13 is a flowchart of transfer determination processing of the embodiment of the present invention.

The component mounting apparatus 1 of the present invention has the above-mentioned structure, and transfer determination processing for the substrates 2 will be described below with reference to a flowchart of FIG. 13. The transfer control unit 65 determines and performs a predetermined transfer mode according to the result of processing performed here. First, the transfer control unit 65 determines whether or not forced transfer is set to be valid (ST1: a step of determining the setting of forced transfer). If forced transfer is not set to be valid, the transfer control unit 65 transfers the substrates 2 in the "normal transfer mode" (ST2: a step of performing the normal transfer mode).

If forced transfer is not set to be valid in (ST1), the transfer control unit 65 determines whether or not upstream waiting time is generated (ST3: a step of determining upstream waiting time). That is, in this step, it is determined whether preparation for transferring the substrates 2 is not completed in the substrate carrying-in unit 6 although preparation for transferring the substrates 2 has been completed in all the mounting work units. The determination performed here is performed on the basis of whether or not upstream waiting time is measured by the time measuring unit 68. If the upstream waiting time is not generated, the transfer control unit 65 transfers the substrates 2 in the normal transfer mode (ST2).

If the upstream waiting time is generated in (ST3), the transfer control unit 65 determines whether or not the upstream waiting time exceeds preset allowed time (ST4: a step of determining allowed time excess). While the upstream waiting time does not exceed the allowed time, the transfer control unit 65 transfers the substrates 2 in the normal transfer mode. Steps of (ST3) and (ST2) or (ST3), (ST4), and (ST2) are performed under a state in which the transfer of the substrate 2 between the work units is smoothly performed without the delay of the preparation for transferring the substrates 2 in each work unit even though forced transfer is set to be valid. On the other hand, if the upstream waiting time exceeds the allowed time, the transfer control unit 65 transfers the substrates 2 according to the forced transfer mode (ST5: a step of performing the forced transfer mode).

Figure 14:
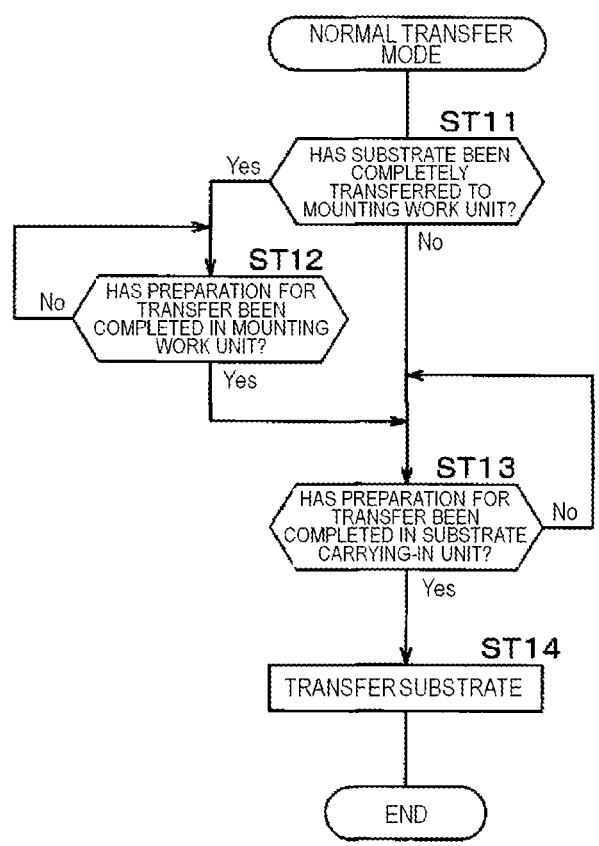
FIG. 14 is a flowchart of a normal transfer mode of the embodiment of the present invention.

Next, substrate transfer processing in the normal transfer mode will be described with reference to a flowchart of FIG. 14. First, the transfer control unit 65 determines whether or not the substrates 2 are transferred to at least one mounting work unit among the plurality of mounting work units (the tape attaching unit 8, the component mounting unit 21, and the component compression unit 35) (ST11: a step of determining the presence/absence of the transfer of the substrates in the mounting work unit). If the substrates 2 are transferred, it is determined whether or not preparation for transferring the substrates 2 has been completed in the mounting work unit of a transfer destination (ST12: a step of determining the completion of preparation for transfer in the mounting work unit). If there is a plurality of mounting work units of a transfer destination, it is determined whether or not preparation for transferring the substrates 2 has been completed in all the mounting work units.

If the substrates 2 are not transferred to the mounting work unit in (ST11) or if the preparation for transferring the substrates 2 has been completed in (ST12), the transfer control unit 65 determines whether or not the preparation for transferring the substrates 2 has been completed in the substrate carrying-in unit 6 (ST13: a step of determining the completion of preparation for transfer in the substrate carrying-in unit). If the preparation for transferring the substrates 2 has been completed, all the substrates 2 are simultaneously transferred to the downstream side (ST14: a step of transferring the substrates). Since the completion of the preparation for transfer in the substrate carrying-in unit 6 is a requirement for the transfer of the substrates 2 in the normal transfer mode as described above, an operation for transferring the substrates 2 to the tape attaching unit 8 from the substrate carrying-in unit 6 is necessarily included in the normal transfer mode.

Figure 15A:
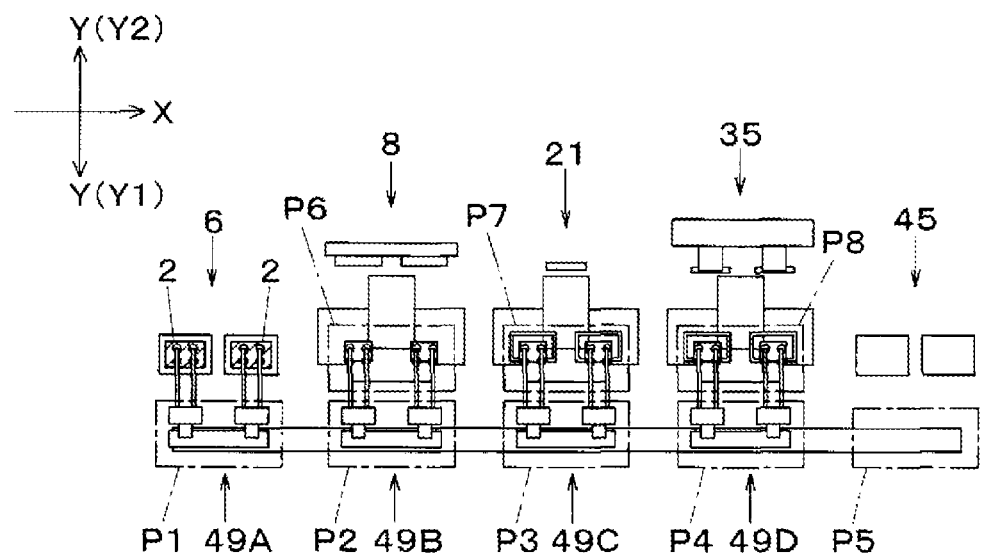
FIGS. 15A, 15B, and 15C illustrate a substrate transfer operation in a normal mode of the embodiment of the present invention.

Next, a series of operations for transferring the substrates 2 in the normal transfer mode will be described with reference to FIGS. 15A to 17B. First, when the substrates 2 are carried into the substrate carrying-in unit 6 from the upstream facility and preparation for transferring the substrates 2 to the tape attaching unit 8 has been completed as shown in FIG. 15A, the transfer control unit 65 moves the first substrate transfer mechanism 49A to the first position P1, moves the second substrate transfer mechanism 49B to the second position P2, moves the third substrate transfer mechanism 49C to the third position P3, and moves the fourth substrate transfer mechanism 49D to the fourth position P4 in synchronization. Hereinafter, the movement of the substrate transfer mechanisms 49A to 49D in the X direction is referred to as "upstream-side movement". After that, substrates 2, which have been completely subjected to the preparation for transfer in the substrate carrying-in unit 6, are held by the first substrate transfer mechanism 49A.

Figure 15B:
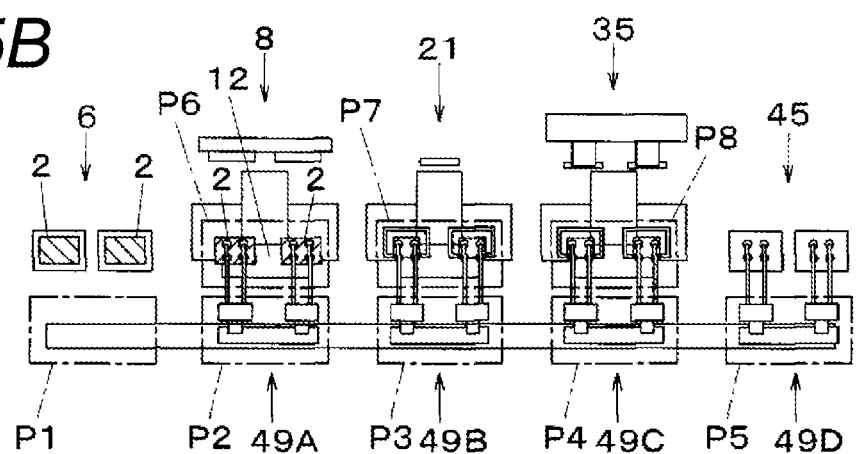

Then, as shown in FIG. 15B, the transfer control unit 65 moves the first substrate transfer mechanism 49A to the second position P2, moves the second substrate transfer mechanism 49B to the third position P3, moves the third substrate transfer mechanism 49C to the fourth position P4, and moves the fourth substrate transfer mechanism 49D to the fifth position P5 in synchronization. Hereinafter, the movement of the substrate transfer mechanisms 49A to 49D in the X direction is referred to as "downstream-side movement". After that, the substrates 2, which are held by the first substrate transfer mechanism 49A, are transferred to the moving stage 12 that is moved to the sixth position P6. Then, tape attaching work is performed on the substrates 2 placed on the moving stage 12. While the tape attaching work is performed, substrates 2 are carried into the substrate carrying-in unit 6 anew.

Figure 15C:
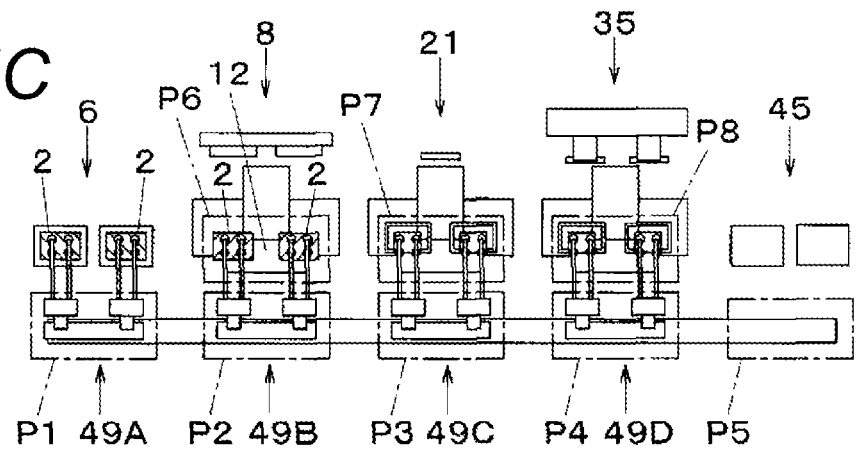

After that, when the substrates 2 are carried into the substrate carrying-in unit 6, the transfer control unit 65 performs the upstream-side movement of the substrate transfer mechanisms 49A to 49D as shown in FIG. 15C. Further, substrates 2, which have been completely subjected to the preparation for transfer in the substrate carrying-in unit 6, are held by the first substrate transfer mechanism 49A and substrates 2 placed on the moving stage 12, which is moved to the sixth position P6 again after the completion of the tape attaching work (which has been completely subjected to the preparation for transfer), are held by the second substrate transfer mechanism 49B.

Figure 16A:
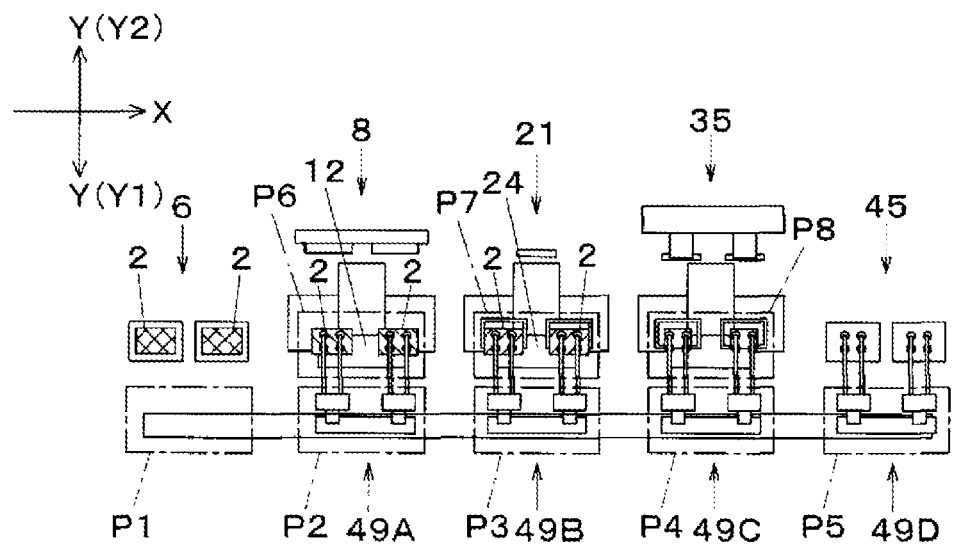
FIGS. 16A, 16B, and 16C illustrate the substrate transfer operation in the normal mode of the embodiment of the present invention.

Next, after performing the downstream-side movement of the substrate transfer mechanisms 49A to 49D as shown in FIG. 16A, the transfer control unit 65 transfers the substrates 2 held by the first substrate transfer mechanism 49A to the moving stage 12 and transfers the substrates 2 held by the second substrate transfer mechanism 49B to the moving stage 24 moved to the seventh position P7. As described above, the second substrate transfer mechanism 49B serves as a first substrate transfer unit that transfers the substrate 2, to which the individual tape 4b1 (adhesive tape) is attached, to the component mounting unit 21 from the tape attaching unit 8.

Figure 16B:
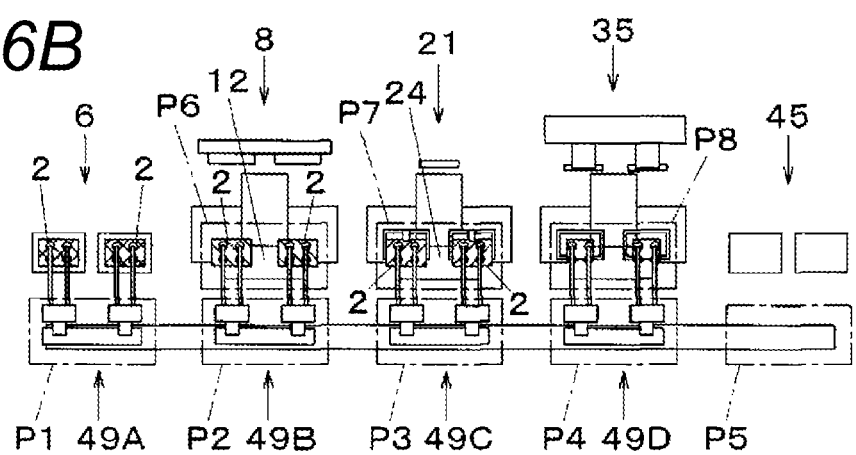

After that, tape attaching work is performed on the substrates 2 placed on the moving stage 12 and component mounting work is performed on the substrates 2 placed on the moving stage 24. While various kinds of mounting work are performed in the respective mounting work units, substrates 2 are carried into the substrate carrying-in unit 6 anew. Next, when the substrates 2 are carried into the substrate carrying-in unit 6, the transfer control unit 65 performs the upstream-side movement of the substrate transfer mechanisms 49A to 49D as shown in FIG. 16B. Further, substrates 2, which have been completely subjected to the preparation for transfer in the substrate carrying-in unit 6, are held by the first substrate transfer mechanism 49A and substrates 2, which have been completely subjected to the preparation for transfer in the tape attaching unit 8, are held by the second substrate transfer mechanism 49B. Furthermore, substrates 2 placed on the moving stage 24, which is moved to the seventh position P7 again after the completion of the component mounting work (which has been completely subjected to the preparation for transfer), are held by the third substrate transfer mechanism 49C.

Figure 16C:
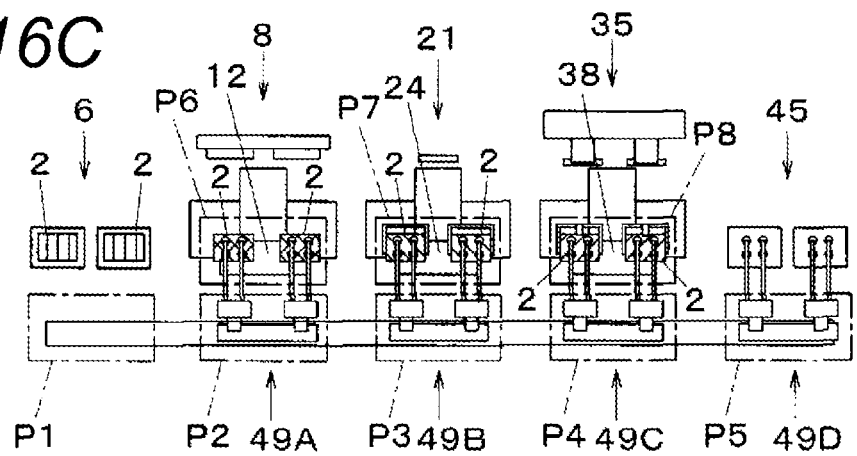

After that, as shown in FIG. 16C, the transfer control unit 65 performs the downstream-side movement of the substrate transfer mechanisms 49A to 49D, transfers the substrates 2 held by the first substrate transfer mechanism 49A to the moving stage 12, and transfers the substrates 2 held by the second substrate transfer mechanism 49B to the moving stage 24. Moreover, the transfer control unit 65 transfers the substrate 2 held by the third substrate transfer mechanism 49C to the moving stage 38. As described above, the third substrate transfer mechanism 49C serves as a second substrate transfer unit that transfers the substrate 2, on which the component 5 is mounted, to the component compression unit 35 from the component mounting unit 21.

After that, tape attaching work is performed on the substrates 2 placed on the moving stage 12 and component mounting work is performed on the substrates 2 placed on the moving stage 24. Moreover, component compression work is performed on the substrates 2 placed on the moving stage 38. While various kinds of mounting work are performed in the respective mounting work units, substrates 2 are carried into the substrate carrying-in unit 6 anew (FIG. 16C).

Figure 17A:
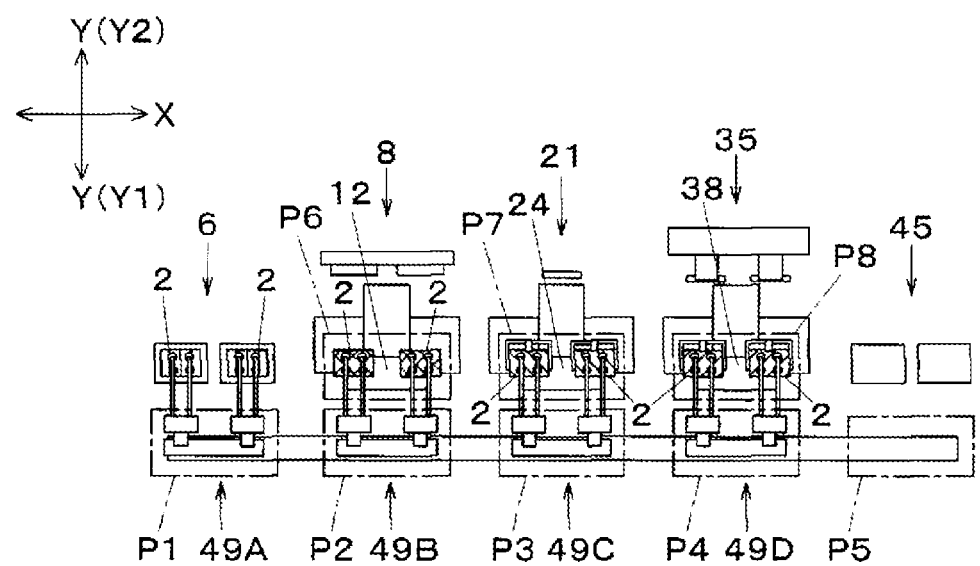
FIGS. 17A and 17B illustrate the substrate transfer operation in the normal mode of the embodiment of the present invention.

Next, when the substrates 2 are carried into the substrate carrying-in unit 6, the transfer control unit 65 performs the upstream-side movement of the substrate transfer mechanisms 49A to 49D as shown in FIG. 17A. After that, substrates 2, which have been completely subjected to the preparation for transfer in the substrate carrying-in unit 6, are held by the first substrate transfer mechanism 49A and substrates 2, which have been completely subjected to the preparation for transfer in the tape attaching unit 8, are held by the second substrate transfer mechanism 49B. Furthermore, substrates 2, which have been completely subjected to the preparation for transfer in the component mounting unit 21, are held by the third substrate transfer mechanism 49C and substrates 2, which are moved to the eighth position P8 again after the completion of the component compression work (which has been completely subjected to the preparation for transfer), are held by the fourth substrate transfer mechanism 49D.

Figure 17B:
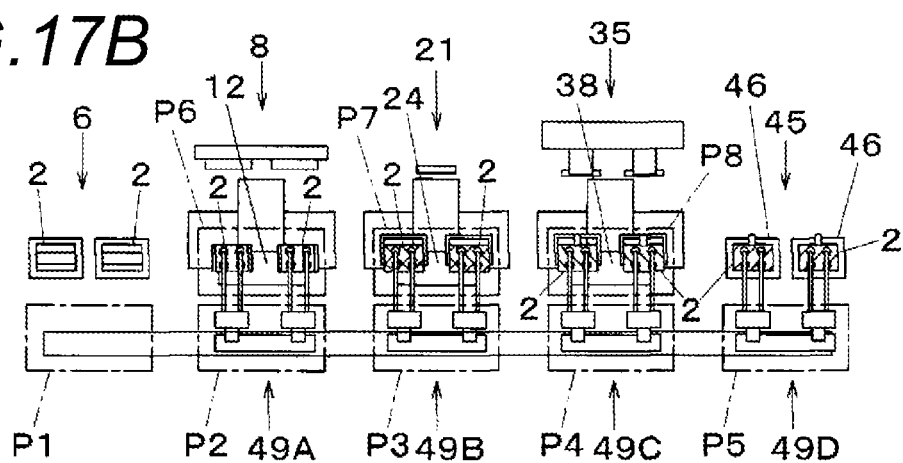

Then, the transfer control unit 65 performs the downstream-side movement of the substrate transfer mechanisms 49A to 49D as shown in FIG. 17B. Further, the transfer control unit 65 transfers the substrates 2 held by the first substrate transfer mechanism 49A to the moving stage 12 and transfers the substrates 2 held by the second substrate transfer mechanism 49B to the moving stage 24. Furthermore, the transfer control unit 65 transfers the substrates 2 held by the third substrate transfer mechanism 49C to the moving stage 38 and transfers the substrates 2 held by the fourth substrate transfer mechanism 49D to the substrate holding tables 46 of the substrate carrying-out unit 45. The substrates 2, which are transferred to the substrate carrying-out unit 45, are carried to the downstream facility at the same timing as a timing at which the substrates 2 are transferred between the work units or at a timing before the timing. As described above, the fourth substrate transfer mechanism 49D serves as a third substrate transfer unit that transfers the substrate 2, on which the component 5 is mounted and compressed, to the substrate carrying-out unit 45 from the component compression unit 35.

In the above-mentioned normal transfer mode, the transfer of the substrates 2, which have been completely subjected to the preparation for transfer in the substrate carrying-in unit 6, and the transfer of the substrates 2, which have been completely subjected to the preparation for transfer in each mounting work unit, are simultaneously performed while the completion of the preparation for transferring the substrates 2 in the substrate carrying-in unit 6 is used as a requirement. Accordingly, since the substrates 2 are efficiently transferred between the work units, it is possible to improve work tact.

Figure 18:
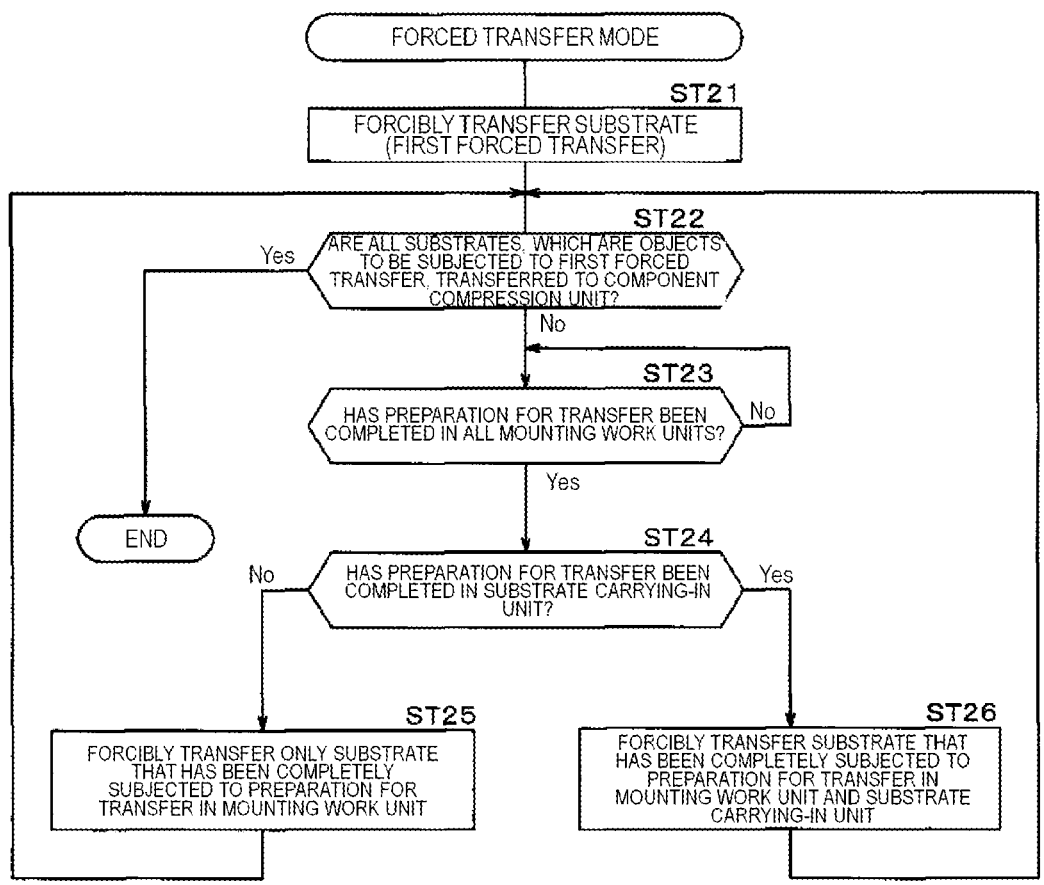
FIG. 18 is a flowchart of a forced transfer mode of the embodiment of the present invention.

Next, substrate transfer processing in the forced transfer mode will be described with reference to a flowchart of FIG. 18. First, the transfer control unit 65 transfers the substrates 2, which have been completely subjected to the preparation for transfer in all the mounting work units, to the downstream side while the preparation for transferring the substrates 2 in the substrate carrying-in unit 6 is not completed. The aspect of the transfer at this time corresponds to forced transfer (ST21: a first forced transfer step). That is, in the forced transfer mode, the substrates 2, which have been completely subjected to the preparation for transfer in the mounting work unit, are transferred to the downstream side regardless of the state of the preparation for transferring the substrates 2 in the substrate carrying-in unit 6. Mounting work is performed on the forcibly transferred substrates 2 in the mounting work unit of a forced transfer destination. Accordingly, it is possible to perform the compression of the component 5 on the substrate 2, which has waited in a predetermined mounting work unit for a long time exceeding allowed time, ahead of time.

After that, the transfer control unit 65 determines whether or not all substrates 2 forcibly transferred to the downstream side in (ST21) are transferred to the component compression unit 35 provided in the final step of the mounting work (ST22: a step of determining the transfer of the substrates to the component compression unit). When all the substrates 2 are transferred to the component compression unit 35, the forced transfer mode is ended. Further, the measurement of upstream waiting time performed by the time measuring unit 68 is cleared.

Meanwhile, if all the substrates 2 are not forcibly transferred to the component compression unit 35 in (ST22), various kinds of mounting work are performed on all the substrates 2 forcibly transferred to the respective mounting work units and it is determined whether or not preparation for transferring the substrates to the downstream side has been completed (ST23: a step of determining the completion of the preparation for transfer in the mounting work unit). In this embodiment, a case in which the forcibly transferred substrate 2 is present in the component mounting unit 21 corresponds to this.

After the preparation for transferring the substrates 2 is completed, the transfer control unit 65 determines whether or not the preparation for transferring the substrates 2 has been completed in the substrate carrying-in unit 6 (ST24: a step of determining the completion of the preparation for transfer in the substrate carrying-in unit). This step is a step considering a case in which substrates 2 are carried into the substrate carrying-in unit 6 and preparation for transfer is completed while mounting work is performed on the forcibly transferred substrates 2. Meanwhile, the setting of allowed time may be changed in a limited way after the completion of the preparation for transfer in the mounting work unit, and upstream waiting time until the completion of the preparation for transfer in the substrate carrying-in unit 6 may be measured. At this time, it is preferable that the changed allowed time be set to be very short (for example, 1 sec) since component compression work needs to be quickly performed on the forcibly transferred substrates 2.

If the preparation for transferring the substrates 2 has not been completed in (ST24), only the substrates 2, which have been completely subjected to the preparation for transfer in each mounting work unit, are forcibly transferred to the downstream side (ST25: a second forced transfer step). After that, various kinds of mounting work are performed on the substrates 2 in the mounting work unit of a forced transfer destination. After forced transfer is performed, the processing returns to (ST22).

On the other hand, if the preparation for transferring the substrate 2 has been completed in (ST24), the substrates 2, which have been completely subjected to the preparation for transfer in the substrate carrying-in unit 6, and the substrates 2, which have been completely subjected to the preparation for transfer in each mounting work unit, are forcibly transferred to the downstream side at the same time (ST26: a third forced transfer step). After that, mounting work is performed on the substrate 2 in the mounting work unit of a forced transfer destination. Since the substrates 2, which have been completely subjected to the preparation for transfer in the substrate carrying-in unit 6, are also forcibly transferred in this way, it is possible to improve work tact. After forced transfer is performed, the processing returns to (ST22). Meanwhile, since the substrates 2, which are forcibly transferred from the substrate carrying-in unit 6, are not substrates that are forcibly transferred in (ST1), the substrates 2, which are forcibly transferred from the substrate carrying-in unit 6, are excluded from an object to be determined in (ST22).

Figure 19A:
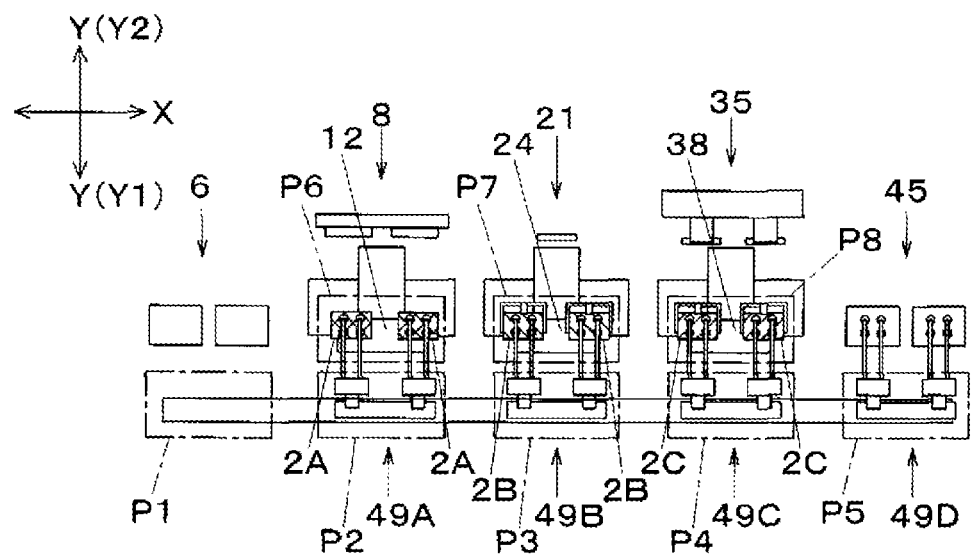
FIGS. 19A, 19B, and 19C illustrate a substrate transfer operation in the forced transfer mode of the embodiment of the present invention.

Next, an example of a forced transfer operation, which is performed according to the forced transfer mode, will be described with reference to FIGS. 19A to 20B. FIG. 19A shows a state in which preparation for transferring substrates 2A, 2B, and 2C, which are transferred to the tape attaching unit 8, the component mounting unit 21, and the component compression unit 35, to the downstream side has been completed but preparation for transfer has not been completed due to the delay of the carrying of the substrates 2 into the substrate carrying-in unit 6. When the upstream waiting time exceeds allowed time in this state, the transfer control unit 65 performs the transfer of the substrates 2 according to the forced transfer mode.

Figure 19B:
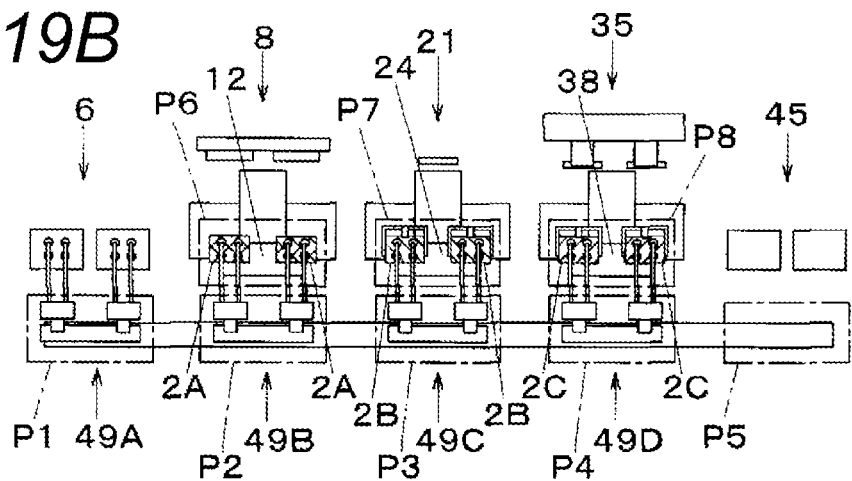

First, the transfer control unit 65 forcibly transfers the substrates 2A, 2B, and 2C to the downstream side (first forced transfer) (ST21). That is, after performing the upstream-side movement of the substrate transfer mechanisms 49A to 49D as shown in FIG. 19B, the transfer control unit 65 holds the substrates 2A by the second substrate transfer mechanism 49B and holds the substrates 2B by the third substrate transfer mechanism 49C. Further, the transfer control unit 65 holds the substrates 2C by the fourth substrate transfer mechanism 49D.

Figure 19C:
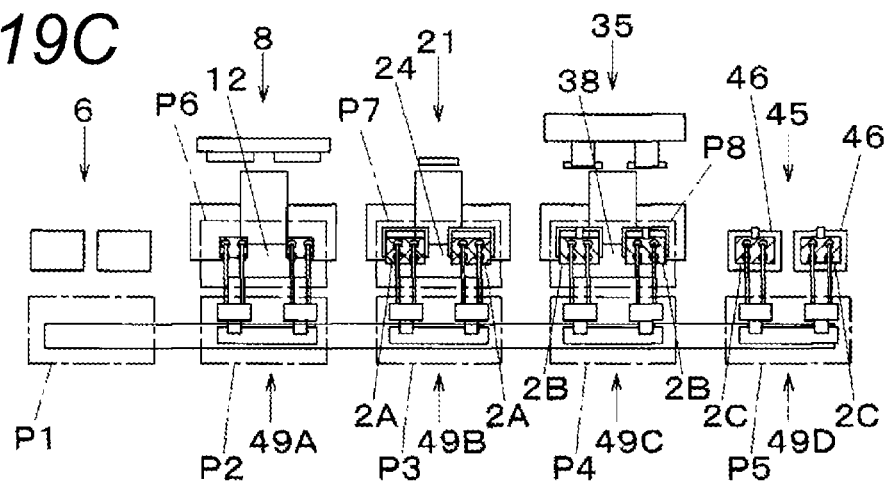

After that, after performing the downstream-side movement of the substrate transfer mechanisms 49A to 49D as shown in FIG. 19C, the transfer control unit 65 transfers the substrates 2A to the moving stage 24 and transfers the substrates 2B to the moving stage 38. Furthermore, the transfer control unit 65 transfers the substrates 2C to the substrate holding tables 46. Accordingly, the substrates 2A, 2B, and 2C are forcibly transferred to the work units that are provided on the downstream side. After that, component mounting work is performed on the substrates 2A, and component compression work is performed on the substrates 2B. Accordingly, it is possible to quickly compress the components 5 to the substrates 2B of which upstream waiting time exceeds the allowed time. As a result, it is possible to suppress the generation of a substrate having a mounting defect, which is caused by the deterioration of joining quality, by suppressing the deterioration of the individual tape 4b1.

Here, the substrates 2A, which have waited in the tape attaching unit 8 when the previous forced transfer of the substrates is performed, are not transferred to the component compression unit 35 (ST22). Accordingly, when various kinds of mounting work are performed on the substrates 2A and 2B and preparation for transferring the substrates to the downstream side has been completed (ST23), the substrates 2A and 2B are forcibly transferred (second forced transfer) (ST25) after it is determined whether or not preparation for transferring the substrates 2 has been completed in the substrate carrying-in unit 6 during the mounting work and the preparation for transferring the substrates (ST24).

Figure 20A:
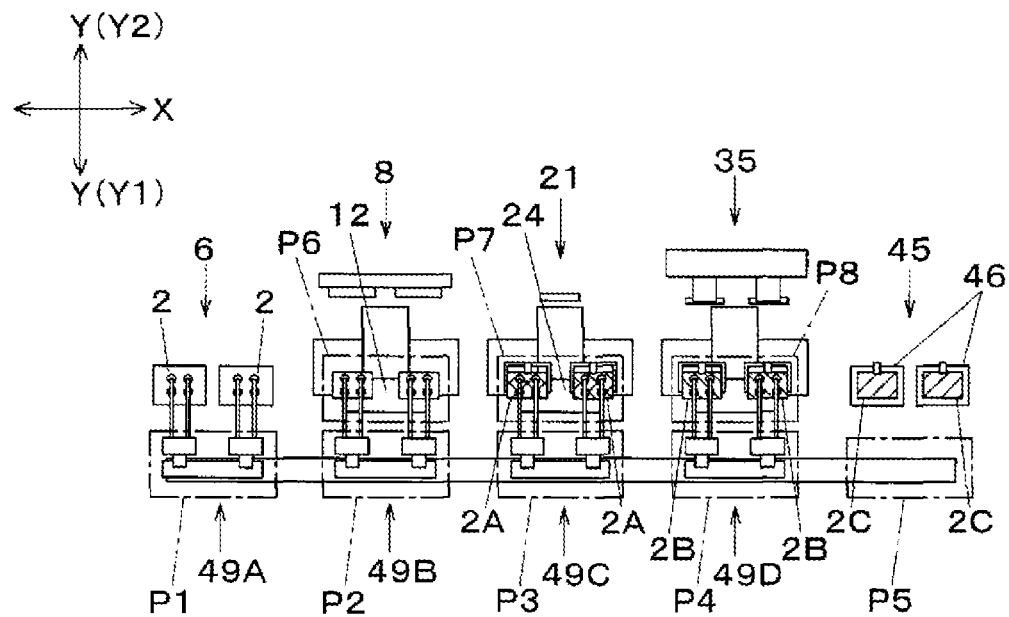
FIGS. 20A and 20B illustrate the substrate transfer operation in the forced transfer mode of the embodiment of the present invention.

That is, after performing the upstream-side movement of the substrate transfer mechanisms 49A to 49D as shown in FIG. 20A, the transfer control unit 65 holds the substrates 2A by the third substrate transfer mechanism 49C and holds the substrates 2B by the fourth substrate transfer mechanism 49D. Further, the transfer control unit 65 holds the substrates 2C placed on the substrate holding tables 46, which have been completely subjected to preparation for carrying the substrates to the mounting facility that is present on the downstream side, by the downstream facility-transfer means (not shown). Meanwhile, the substrates 2C may be carried in advance by the downstream facility-transfer means. In this embodiment, the preparation for transferring the substrates 2 in the substrate carrying-in unit 6 has not been completed.

Figure 20B:
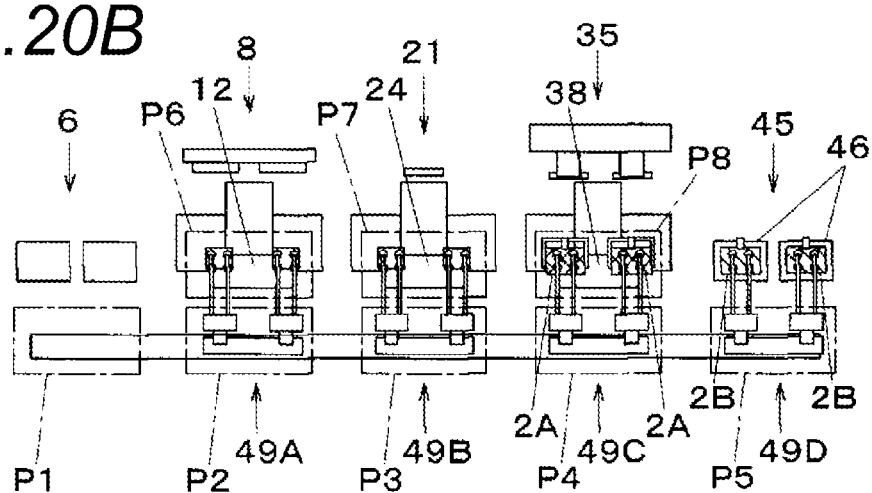

After that, after performing the downstream-side movement of the substrate transfer mechanisms 49A to 49D as shown in FIG. 20B, the transfer control unit 65 transfers the substrates 2A to the moving stage 38 and transfers the substrates 2B to the substrate holding tables 46. Since the substrates 2A have been transferred to the component compression unit 35 by this forced transfer operation, the transfer control unit 65 ends the forced transfer mode. Then, components 5 are compressed to the substrates 2A placed on the moving stage 38.

That is, various kinds of work, which are performed up to the compression of the components 5, are continuously performed on the substrates 2A that have waited in the tape attaching unit 8, regardless of the state of the preparation for transferring the substrates in the substrate carrying-in unit 6. That is, the components 5 are compressed to the substrates in the component compression unit 35 before the deterioration of the individual tapes 4b1 that are attached to the substrates 2A forcibly transferred to the downstream side from the tape attaching unit 8. Accordingly, it is possible to suppress the generation of a plurality of substrates having mounting defects, which are caused by the deterioration of joining quality, by performing the compression of the components 5 ahead of time before the deterioration of the individual tapes 4b1 attached to not only the substrates 2B that have waited in the component mounting unit 21 but also the substrates 2A that have waited in the tape attaching unit 8, that is, the most upstream mounting work unit.

As described above, according to the present invention, when preparation for transferring the substrates 2 to the tape attaching unit 8 is not completed in the substrate carrying-in unit 6 within a predetermined time (within allowed time) after the start of the measurement of time performed by the time measuring unit 68, the respective substrates 2, which wait in the tape attaching unit 8, the component mounting unit 21, and the component compression unit 35, are forcibly transferred to their downstream sides and predetermined works (mounting works) are performed on the respective substrates 2 that are forcibly transferred to the component mounting unit 21 and the component compression unit 35. Accordingly, even when the preparation for transferring the substrates 2 to the downstream side is delayed in the work unit present on the upstream side of the tape attaching unit 8, it is possible to suppress the generation of substrates having mounting defects, which are caused by the deterioration of joining quality, by transferring the substrates, to which the individual tapes 4b1 have been attached and which are not subjected to compression, to the downstream side ahead of time and quickly performing the compression of the components 5.

Further, it is possible to establish both the improvement of work tact and the prevention of the generation of a substrate, which has a mounting defect, by transferring the substrates 2 while selectively using the normal transfer mode and the forced transfer mode. Furthermore, considering the characteristics, for example, adhesion of the ACF tape 4b to be used, an operator arbitrarily sets allowed time, which has passed until the compression of the component 5 is performed after the individual tape 4b1 is attached to the substrate 2, according to time where it is considered that the ACF tape has constant adhesion under a normal temperature environment. Accordingly, it is possible to compress the component 5 while suppressing the deterioration of the individual tape 4b1 that is attached to the forcibly transferred substrate 2.

The present invention is not limited to the embodiment having described above. For example, the number of the substrate holding tables of each work unit may be arbitrary. Further, the number of the mounting work units may also be arbitrary, and a plurality of the same type of mounting work units may installed.

The present invention is particularly useful in the field of electronic component mounting in which a component can be compressed with the suppression of the deterioration of an adhesive tape and a component is mounted on a substrate with an adhesive tape interposed therebetween.

What is claimed is:

1. A component mounting apparatus comprising:
    a tape attaching unit that attaches an adhesive tape to a substrate;
    a component mounting unit that is provided on a downstream side of the tape attaching unit and mounts a component on the adhesive tape attached to the substrate;
    a component compression unit that is provided on a downstream side of the component mounting unit and compresses the component, which is mounted on the substrate, to the substrate with the adhesive tape interposed therebetween;
    a first substrate transfer unit that transfers the substrate, to which the adhesive tape is attached, to the component mounting unit from the tape attaching unit;
    a second substrate transfer unit that transfers the substrate, on which the component is mounted, to the component compression unit from the component mounting unit;
    a time measuring unit that measures time having passed after completion of predetermined work performed on all the substrates transferred to the tape attaching unit, the component mounting unit, and the component compression unit, respectively; and
    a controller that includes a normal transfer mode in which a normal transfer of the substrate is performed and a forced transfer mode in which a forced transfer of the substrate is performed,
    wherein when preparation for transferring the substrates to the tape attaching unit is not completed within a predetermined time after the start of measurement performed by the time measuring unit, the controller automatically changes from the normal transfer mode to the forced transfer mode to forcibly transfer the respective substrates, which wait in the tape attaching unit, the component mounting unit, and the component compression unit, to their downstream sides and to perform predetermined works on the respective substrates that are forcibly transferred to the component mounting unit and the component compression unit;
    the component mounting apparatus further comprising a forced transfer setting unit that sets conditions required for the forced transfer of the substrate based on the time measured by the time measuring unit.

2. The component mounting apparatus according to claim 1, wherein
    the component compression unit comprises a substrate positioning mechanism for positioning the substrate and a compression mechanism for compressing the component before the controller determines deterioration of the adhesive tape attached to the substrate forcibly transferred to the downstream side from the tape attaching unit.

3. The component mounting apparatus according to claim 1, wherein
    the time measuring unit is adapted to receive a first input from the tape attaching unit, a second input from the component mounting unit, and a third input from the component compression unit, indicating time of completion of preparation for transferring the substrates, which have been completely subjected to kinds of mounting work in the units, respectively, to the downstream side, and is adapted to track the time having passed after completion of said preparation.

4. A component mounting apparatus comprising:
a tape attaching unit that attaches an adhesive tape to a substrate;
a component mounting unit that is provided on a downstream side of the tape attaching unit and mounts a component on the adhesive tape attached to the substrate;
a component compression unit that is provided on a downstream side of the component mounting unit and compresses the component, which is mounted on the substrate, to the substrate with the adhesive tape interposed therebetween;
a substrate carrying-out unit that is provided on a downstream side of the component compression unit and carries out the substrate on which the component is compressed;
a first substrate transfer unit that transfers the substrate, to which the adhesive tape is attached, to the component mounting unit from the tape attaching unit;
a second substrate transfer unit that transfers the substrate, on which the component is mounted, to the component compression unit from the component mounting unit;
a third substrate transfer unit that transfers the substrate, on which the component is compressed, to the substrate carrying-out unit from the component compression unit;
a time measuring unit that measures time having passed after completion of predetermined work performed on all the substrates transferred to the tape attaching unit, the component mounting unit, and the component compression unit, respectively; and
a controller that includes a normal transfer mode in which a normal transfer of the substrate is performed and a forced transfer mode in which a forced transfer of the substrate is performed,
wherein when preparation for transferring the substrates to the tape attaching unit is not completed within a predetermined time after the start of measurement performed by the time measuring unit, the controller automatically changes from the normal transfer mode to the forced transfer mode to cause the first, second and third substrate transfer units to forcibly transfer the respective substrates, which wait in the tape attaching unit, the component mounting unit, and the component compression unit, to their downstream sides and to cause the component mounting unit and the component compression unit to perform predetermined works on the respective substrates that are forcibly transferred by the first and second substrate transfer units to the component mounting unit and the component compression unit,
the component mounting apparatus further comprising a forced transfer setting unit that sets conditions required for the forced transfer of the substrate based on the time measured by the time measuring unit.

5. A component mounting apparatus comprising:
a tape attaching unit that attaches an adhesive tape to a substrate;
a component mounting unit that is provided on a downstream side of the tape attaching unit and mounts a component on the adhesive tape attached to the substrate;
a component compression unit that is provided on a downstream side of the component mounting unit and compresses the component, which is mounted on the substrate, to the substrate with the adhesive tape interposed therebetween;
a first substrate transfer unit that transfers the substrate, to which the adhesive tape is attached, to the component mounting unit from the tape attaching unit;
a second substrate transfer unit that transfers the substrate, on which the component is mounted, to the component compression unit from the component mounting unit;
a timekeeping unit that keeps track of time having passed after completion of predetermined work performed on all the substrates transferred to the tape attaching unit, the component mounting unit, and the component compression unit, respectively; and
a controller that includes a normal transfer mode in which a normal transfer of the substrate is performed and a forced transfer mode in which a forced transfer of the substrate is performed,
wherein when preparation for transferring the substrates to the tape attaching unit is not completed within a predetermined time after the start of timekeeping by the timekeeping unit, the controller automatically changes from the normal transfer mode to the forced transfer mode, and the controller controls the first substrate transfer unit and the second substrate transfer unit so as to forcibly transfer the respective substrates to their downstream sides, and controls the component mounting unit and the component compression unit so as to perform the predetermined works on the respective substrates that are transferred.

* * * * *